United States Patent
Kikuiri et al.

(10) Patent No.: US 9,728,373 B2
(45) Date of Patent: Aug. 8, 2017

(54) PATTERN INSPECTION APPARATUS AND PATTERN INSPECTION METHOD

(71) Applicant: NuFlare Technology, Inc., Yokohama-shi (JP)

(72) Inventors: Nobutaka Kikuiri, Koganei (JP); Ikunao Isomura, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/338,637

(22) Filed: Oct. 31, 2016

(65) Prior Publication Data
US 2017/0125208 A1 May 4, 2017

(30) Foreign Application Priority Data
Nov. 2, 2015 (JP) .................. 2015-216089

(51) Int. Cl.
*H01J 37/26* (2006.01)
*H01J 37/22* (2006.01)
(Continued)

(52) U.S. Cl.
CPC .......... *H01J 37/222* (2013.01); *H01J 37/045* (2013.01); *H01J 37/141* (2013.01); *H01J 37/20* (2013.01);
(Continued)

(58) Field of Classification Search
CPC ............... H01J 37/3045; H01J 37/3177; H01J 2237/30472; H01J 37/30; H01J 37/3002;
(Continued)

(56) References Cited

U.S. PATENT DOCUMENTS

2004/0105578 A1* 6/2004 Tsuchiya ............... G06T 7/0004
382/144
2008/0099676 A1* 5/2008 Sasajima ................ G06T 7/001
250/307
(Continued)

FOREIGN PATENT DOCUMENTS

JP 2005-85618 3/2005
JP 2011-155119 8/2011

*Primary Examiner* — Nicole Ippolito
(74) *Attorney, Agent, or Firm* — Oblon, McClelland, Maier & Neustadt, L.L.P.

(57) ABSTRACT

A pattern inspection apparatus includes a data processing circuitry to input detection data based on a secondary electron from a substrate for each irradiation unit region, where $n_1 \times m_1$ irradiation unit regions in irradiation unit regions configure one of $n_2 \times m_2$ image reference regions configuring an inspection measurement image, to calculate, for each of the $n_2 \times m_2$ image reference regions, a statistic value acquired from the detection data of all the $n_1 \times m_1$ irradiation unit regions in one of the $n_2 \times m_2$ image reference regions, and to define the statistic value as image reference data for the image reference region, and a comparison processing circuitry to receive transmission of the image reference data for each image reference region, and to compare, using a reference image corresponding to the inspection measurement image composed of the $n_2 \times m_2$ image reference regions, the measurement image with the reference image for each image reference region.

10 Claims, 11 Drawing Sheets

(51) Int. Cl.
*H01J 37/20* (2006.01)
*H01J 37/244* (2006.01)
*H01J 37/141* (2006.01)
*H01J 37/04* (2006.01)

(52) U.S. Cl.
CPC ..... *H01J 37/244* (2013.01); *H01J 2237/2448* (2013.01); *H01J 2237/2806* (2013.01); *H01J 2237/2817* (2013.01)

(58) Field of Classification Search
CPC .. H01J 37/3005; H01J 37/3007; H01J 37/304; H01J 37/3174; H01J 37/3175
USPC ........... 250/306, 307, 310, 311, 492.1, 492.3
See application file for complete search history.

(56) References Cited

U.S. PATENT DOCUMENTS

| | | | | |
|---|---|---|---|---|
| 2008/0250380 | A1* | 10/2008 | Kijima | G03F 1/36 716/104 |
| 2013/0082177 | A1* | 4/2013 | Hiroi | G01N 23/2251 250/310 |
| 2015/0206709 | A1* | 7/2015 | Nakayamada | H01J 37/3045 250/491.1 |
| 2016/0005157 | A1* | 1/2016 | Toyoda | G01N 23/225 382/149 |

* cited by examiner

FIG.6A
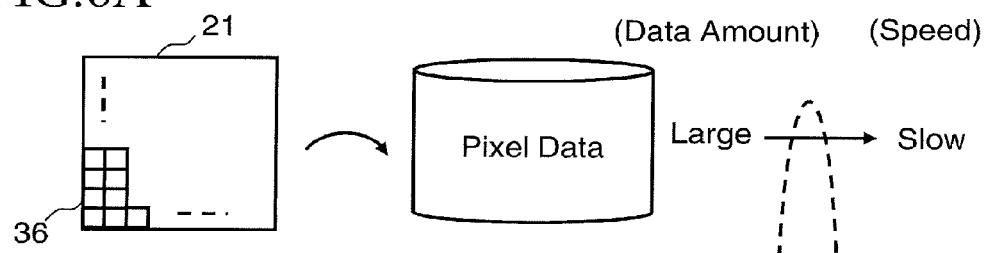
FIG.6B
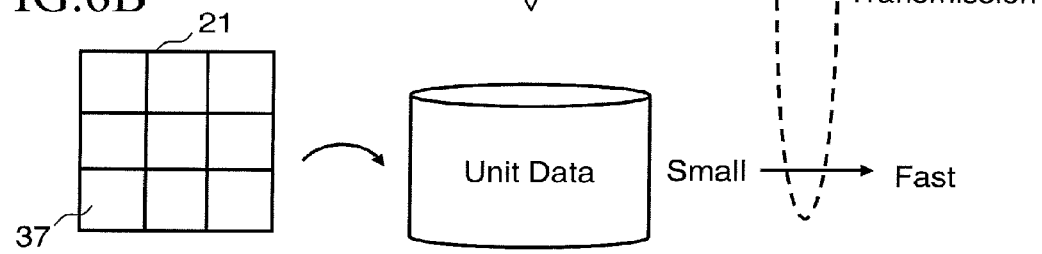
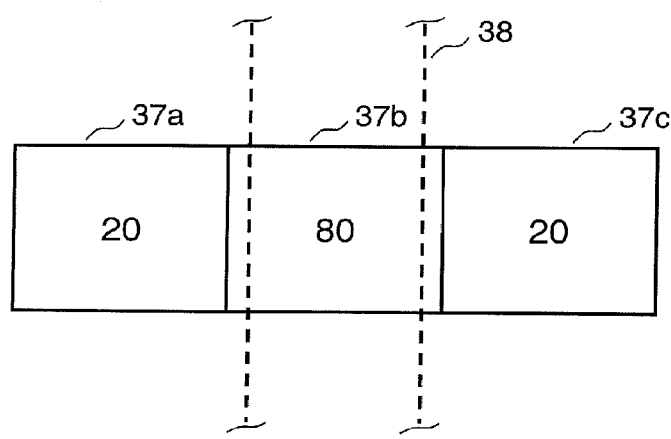
FIG.7

PATTERN INSPECTION APPARATUS AND PATTERN INSPECTION METHOD

CROSS-REFERENCE TO RELATED APPLICATION

This application is based upon and claims the benefit of priority from the prior Japanese Patent Application No. 2015-216089 filed on Nov. 2, 2015 in Japan, the entire contents of which are incorporated herein by reference.

BACKGROUND OF THE INVENTION

Field of the Invention

Embodiments of the present invention relate generally to a pattern inspection apparatus and a pattern inspection method. More specifically, embodiments of the present invention relate, for example, to an inspection apparatus and method which inspects a pattern by acquiring a secondary electron image of a pattern image emitted because of irradiation of an electron beam.

Description of Related Art

In recent years, with the advance of high integration and large capacity of large-scale integration (LSI) circuits, the line width (critical dimension) required for circuits of semiconductor elements is becoming progressively narrower. Such semiconductor elements are manufactured by circuit formation of exposing and transferring a pattern onto a wafer by means of a reduced projection exposure apparatus known as a stepper while using an original or "master" pattern (also called a mask or a reticle, hereinafter generically referred to as a mask) with a circuit pattern formed thereon. Then, in fabricating a mask for transfer printing such a fine circuit pattern onto a wafer, a pattern writing apparatus using electron beams, capable of writing or "drawing" fine circuit patterns, needs to be employed. Pattern circuits may be written directly on the wafer by the pattern writing apparatus. Also, a laser beam writing apparatus that uses laser beams in place of electron beams for writing a pattern is under development.

Since LSI manufacturing requires a tremendous amount of manufacturing cost, it is crucial to improve its yield. However, as typified by a 1-gigabit DRAM (Dynamic Random Access Memory), the scale of patterns configuring an LSI is in transition from on the order of submicrons to nanometers. One of major factors that decrease the yield of the LSI manufacturing is due to pattern defects on the mask used for exposing and transfer printing an ultrafine pattern onto a semiconductor wafer by the photolithography technology. In recent years, with miniaturization of dimensions of LSI patterns formed on a semiconductor wafer, dimension to be detected as a pattern defect has become extremely small. Therefore, a pattern inspection apparatus for inspecting defects on a transfer mask used in manufacturing LSI needs to be more highly accurate.

As an inspection method, there is known a method of comparing an optical image obtained by imaging a pattern formed on a target object or "sample" such as a lithography mask at a predetermined magnification by using a magnification optical system with design data or an optical image obtained by imaging the same pattern on the target object. For example, the methods described below are known as pattern inspection methods: the "die-to-die inspection" method that compares data of optical images of identical patterns at different positions on the same mask; and the "die-to-database inspection" method that inputs, into an inspection apparatus, writing data (design pattern data) generated by converting pattern-designed CAD data to a writing apparatus specific format to be input to the writing apparatus when a pattern is written on the mask, generates design image data (reference image) based on the input writing data, and compares the generated design image data with an optical image (serving as measurement data) obtained by imaging the pattern. In such inspection methods for use in the inspection apparatus, a target object is placed on the stage so that a light flux may scan the target object as the stage moves in order to perform an inspection. Specifically, the target object is irradiated with a light flux from the light source through the illumination optical system. Light transmitted through the target object or reflected therefrom forms an image on a sensor through the optical system. The image captured by the sensor is transmitted as measurement data to the comparison circuit. After performing position adjustment of images, the comparison circuit compares measurement data with reference data in accordance with an appropriate algorithm, and determines that there exists a pattern defect if the compared data are not identical.

The pattern inspection apparatus described above acquires an optical image by irradiating a substrate with a laser beam and capturing a transmission image or a reflection image of a pattern formed on the substrate. On the other hand, there has been developed an inspection apparatus which acquires a pattern image by irradiating a substrate with an electron beam to detect a secondary electron emitted from the substrate (for example, refer to Japanese Unexamined Patent Application Publication (JP-A) No. 2011-155119). A pattern inspection apparatus which inspects a pattern formed on the substrate (semiconductor wafer or exposure mask) by using electron beams, the diameter of the electron beam is narrowed to perform scanning on the substrate in order to acquire pattern information. In that case, in order to obtain resolution of a pattern image, generally, the diameter of the electron beam is narrowed down to a defect size to be detected or below the defect size. For example, when inspecting a wafer of 5 nm TN or less, a defect size to be detected needs to be around 1 nm at a minimum. In such a case, the beam diameter of the electron beam is set to be 1 nm or less. Consequently, the size of one pixel of an image becomes 1 nm, and if expressing one pixel in, for example, 256 gray levels (8 bits), one million pixels are needed to acquire an image of a region of 1 μm square, and therefore, data capacity of 1 Mbytes becomes needed. Thus, data capacity of 10000 Tbytes is required to acquire an image of a region of 100 mm square. If trying to complete data transmission or data processing of 10000 Tbyte data capacity within a general inspection time period in order to perform a die-to-die inspection or die-to-database inspection described above, it becomes necessary, according to the present technology, to mount fairly large-scale processors in a box scale. Moreover, even when generating a reference image from design data, it is also necessary to treat the same data capacity described above. Therefore, it is not realistic to manufacture an inspection apparatus of a scale which can process such an amount of data.

BRIEF SUMMARY OF THE INVENTION

According to one aspect of the present invention, a pattern inspection apparatus includes a stage configured to mount a substrate on which a plurality of figure patterns are formed and to be movable; an electron beam column configured to include an emission source for emitting an electron beam, and a deflector for deflecting the electron beam, and to irradiate the substrate with the electron beam; a detector configured to detect a secondary electron, including a reflection electron, emitted from the substrate because the substrate is irradiated with the electron beam; a data processing circuitry configured to input detection data based on the secondary electron for each irradiation unit region of a plurality of irradiation unit regions on the substrate each of which is irradiated with the electron beam, where $n_1 \times m_1$ (one of $n_1$ and $m_1$ is an integer of 1 or more and another is an integer of 2 or more) irradiation unit regions being two-dimensional in the plurality of irradiation unit regions configure one of $n_2 \times m_2$ (one of $n_2$ and $m_2$ is an integer of 1 or more and another is an integer of 2 or more) image reference regions being two-dimensional configuring an inspection measurement image, to calculate, for each image reference region of the $n_2 \times m_2$ image reference regions, a statistic value acquired from the detection data of all of the $n_1 \times m_1$ irradiation unit regions in an image reference region concerned of the $n_2 \times m_2$ image reference regions, and to define the statistic value as image reference data for the image reference region concerned; and a comparison processing circuitry configured to receive transmission of the image reference data for the each image reference region, and to compare, using a reference image corresponding to the inspection measurement image composed of the $n_2 \times m_2$ image reference regions, the measurement image with the reference image for the each image reference region.

According to another aspect of the present invention, a pattern inspection method includes irradiating a substrate, on which a plurality of figure patterns are formed, with an electron beam; detecting a secondary electron, including a reflection electron, emitted from the substrate because the substrate is irradiated with the electron beam; inputting detection data based on the secondary electron for each irradiation unit region of a plurality of irradiation unit regions on the substrate each of which is irradiated with the electron beam, where $n_1 \times m_1$ (one of $n_1$ and $m_1$ is an integer of 1 or more and another is an integer of 2 or more) irradiation unit regions being two-dimensional in the plurality of irradiation unit regions configure one of $n_2 \times m_2$ (one of $n_2$ and $m_2$ is an integer of 1 or more and another is an integer of 2 or more) image reference regions being two-dimensional configuring an inspection measurement image, and calculating, for each image reference region of the $n_2 \times m_2$ image reference regions, a statistic value acquired from the detection data of all of the $n_1 \times m_1$ irradiation unit regions in an image reference region concerned of the $n_2 \times m_2$ image reference regions; transmitting, for the each image reference region, the statistic value of the each image reference region, as image reference data; and receiving the image reference data for the each image reference region, and comparing, using a reference image corresponding to the inspection measurement image composed of the $n_2 \times m_2$ image reference regions, the measurement image with the reference image for the each image reference region.

BRIEF DESCRIPTION OF THE DRAWINGS

FIGS. 6A and 6B illustrate transmission processing and a data amount according to the first embodiment;

FIG. 7 shows an example of pattern detection in an inspection pixel according to the first embodiment;

DETAILED DESCRIPTION OF THE INVENTION

Embodiments of the present invention describe a pattern inspection apparatus that can perform transmission and data processing without mounting therein fairly large-scale processors whose scales are unrealistic.

First Embodiment

Figure 1:
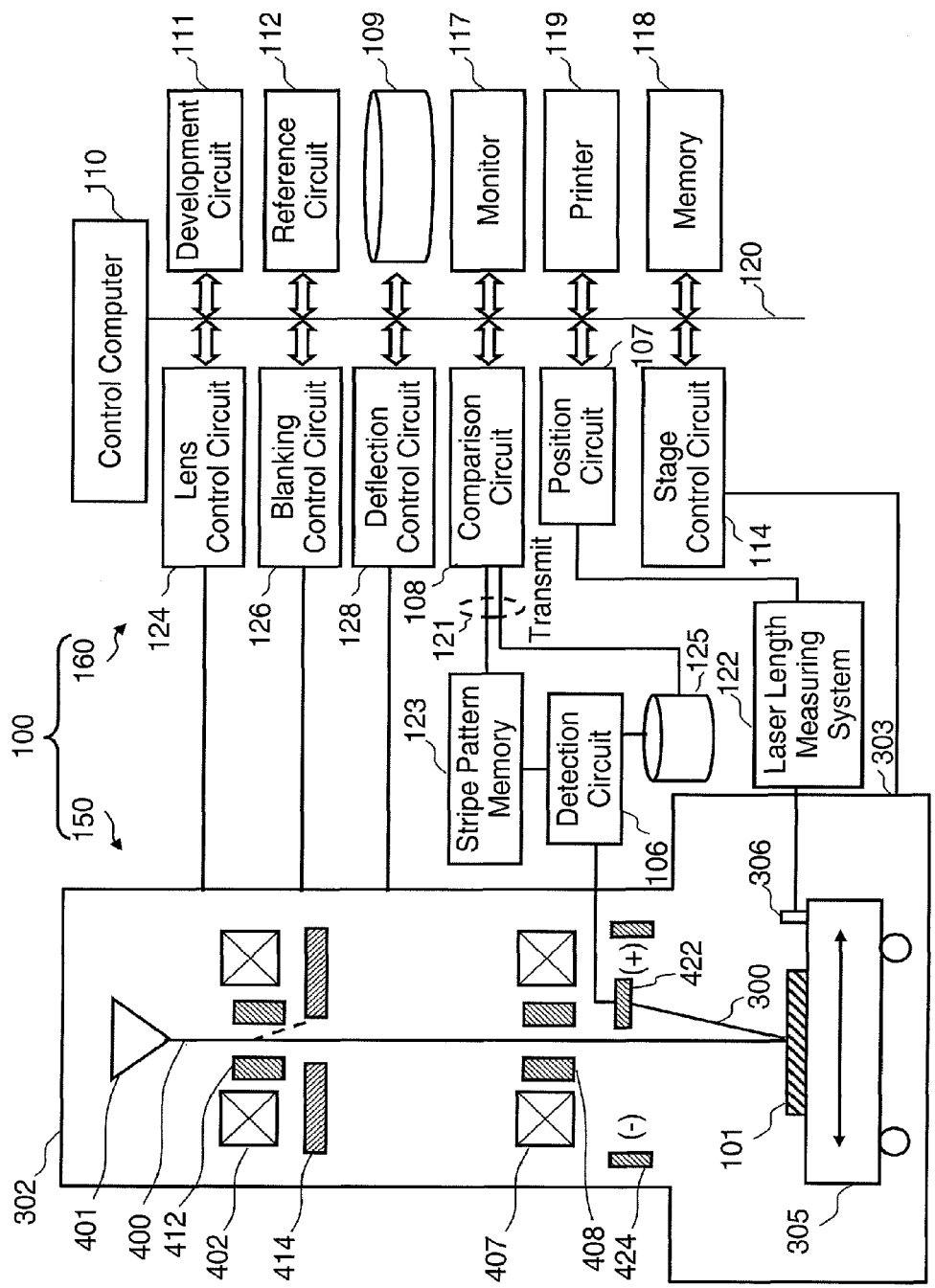
FIG. 1 illustrates a configuration of a pattern inspection apparatus according to a first embodiment.

FIG. 1 illustrates a configuration of a pattern inspection apparatus according to the first embodiment. In FIG. 1, an inspection apparatus 100 that inspects patterns formed on the substrate is an example of an electron beam inspection apparatus. The inspection apparatus 100 includes an optical image acquisition mechanism 150 and a control system circuit 160 (control unit).

The optical image acquisition mechanism 150 includes an electron beam column 302 (electron optical column), an inspection chamber 303, a detection circuit 106, a stripe pattern memory 123, a buffer memory 125, and a laser length measuring system 122. In the electron beam column 302, there are arranged an electron gun 401, an illumination lens 402, a blanking deflector (blanker) 412, a blanking aperture 414, an objective lens 407, a deflector 408, a deflector 424, and a detector 422. In the inspection chamber 303, there is arranged an XY stage 305 which is movable at least in the x-y directions. On the XY stage 305, there is placed a substrate 101 on which a plurality of figure patterns serving as inspection targets are formed. The substrate 101 may be an exposure mask used for manufacturing semiconductor devices, or a semiconductor substrate such as a silicon wafer on which semiconductor devices are formed. The substrate 101 is placed, with its pattern forming surface facing upward, for example, on the XY stage 305. On the XY stage 305, there is arranged a mirror 306 which reflects a laser beam for measuring a laser length emitted from the laser length measuring system 122 arranged outside the inspection chamber 303. The detector 422 is connected at the outside of the electron beam column 302 to the detection circuit 106. The detection circuit 106 is connected to the stripe pattern memory 123.

In the control system circuit 160, a control computer 110 is connected, through a bus 120, to a position circuit 107, a comparison circuit 108, a development circuit 111, a reference circuit 112, a stage control circuit 114, a lens control circuit 124, a blanking control circuit 126, a deflection control circuit 128, a storage device 109 such as a magnetic disk drive, etc., a monitor 117, a memory 118, and a printer 119. The stripe pattern memory 123 is connected to the comparison circuit 108. The XY stage 305 is driven by the stage control circuit 114 under the control of the control computer 110. The XY stage 305 can be moved by a drive system such as a three-axis (X, Y, and θ) motor, which drives the stage in the directions of x, y, and θ. For example, a step motor can be used as each of these X, Y, and θ motors (not shown). The XY stage 305 is movable in the horizontal direction and the rotation direction by the motors of the X-, Y-, and θ-axis. The movement position of the XY stage 305 is measured by the laser length measuring system 122, and supplied to the position circuit 107. The laser length measuring system 122 measures the position (length) of the XY stage 305 by receiving a catoptric light from the mirror 306 based on the principle of laser interferometry.

A high voltage power supply circuit (not shown) is connected to the electron gun 401. The high voltage power supply circuit applies an acceleration voltage between the cathode and the anode (not shown) in the electron gun 401. By applying this acceleration voltage and a predetermined bias voltage, and by heating the cathode at a predetermined temperature, electrons emitted from the cathode are accelerated to become an electron beam. For example, electron lenses are used as the illumination lens 402 and the objective lens 407, both of which are controlled by the lens control circuit 124. The blanking deflector (blanker) 412 is configured by a control electrode and a counter electrode being a pair, for example. The blanking control circuit 126 applies a control potential to the control electrode, and a ground potential to the counter electrode. The deflector 408 is configured by at least four electrodes, and controlled by the deflection control circuit 128. The deflector 424 is configured by at least two electrodes, and controlled by the deflection control circuit 128.

In the case of the substrate 101 being an exposure mask, when a plurality of figure patterns are formed on the exposure mask by a writing apparatus (not shown), such as an electron beam writing apparatus, writing data used by the writing apparatus is input to the inspection apparatus 100 from the outside, and stored in the storage device 109. In the case of the substrate 101 being a semiconductor substrate, exposure image data, which defines an exposure image to be formed on the semiconductor substrate when a mask pattern of the exposure mask is exposure transferred to the semiconductor substrate, is input into the inspection apparatus 100 from the outside, and stored in the storage device 109. The exposure image data may be generated by a space image capturing device (not shown), for example.

FIG. 1 shows configuration elements necessary for describing the first embodiment. It should be understood that other configuration elements generally necessary for the writing apparatus 100 may also be included therein.

When the electron beam 400 emitted from the electron gun 401 (emitter) is refracted to be a collimated beam on the axis by the illumination lens 402 (electromagnetic lens) controlled by the lens control circuit 124 and passes through the blanking deflector 412, if in the ON state, for example, the beam illuminates the whole opening of the blanking aperture 414 by the blanking deflector 412 which is controlled by the blanking control circuit 126. If in the OFF state, the beam is deflected by the blanking deflector 412 which is controlled by the blanking control circuit 126 such that the entire beam is blocked by the blanking aperture member 414. The electron beam 400 that has passed through the blanking aperture 414 during the period from the time of beam OFF becoming beam ON to the time of again becoming beam OFF serves as one shot of the electron beam. The blanking deflector 412 controls the direction of the passing electron beam 400 to alternately generate a beam ON state and a beam OFF state. For example, when in the beam ON state, the blanking control circuit 126 applies no voltage to the control electrode of the blanking deflector 412, and, when in the beam OFF state, it applies a voltage to the control electrode of the blanking deflector 412. The dose per shot of the electron beam 400 to irradiate the substrate 101 is adjusted depending upon an irradiation time of each shot.

As described above, the electron beam 400 of each shot generated by passing through the blanking deflector 412 and the blanking aperture 414 is shaped to be circular or quadrangular based on the shape of the opening of the blanking aperture 414. Then, after passing through the blanking aperture 414, the electron beam 400 of the aperture image is focused to the pattern forming surface of the substrate 101 by the objective lens 407 and deflected by the deflector 408, and illuminates a desired position on the substrate 101 placed on the XY stage 105 which moves continuously. Thus, the electron beam column 302 irradiates the substrate 101 with the electron beam 400. A secondary electron 300, including a reflection electron, emitted from the substrate 101 because the electron beam 400 irradiates a desired position of the substrate 101 is deflected toward the detector 422 side by the deflector 424, and detected when being incident to the detector 422. The secondary electron 300 has a smaller kinetic energy (motion energy) compared with the electron beam 400 for irradiation. Therefore, the deflector 424 can deflect only the secondary electron 300, which has a smaller kinetic energy than the electron beam 400 for irradiation, by generating a weak electric field, without deflecting the electron beam 400 for irradiation having been accelerated by a large acceleration voltage.

Figure 2:
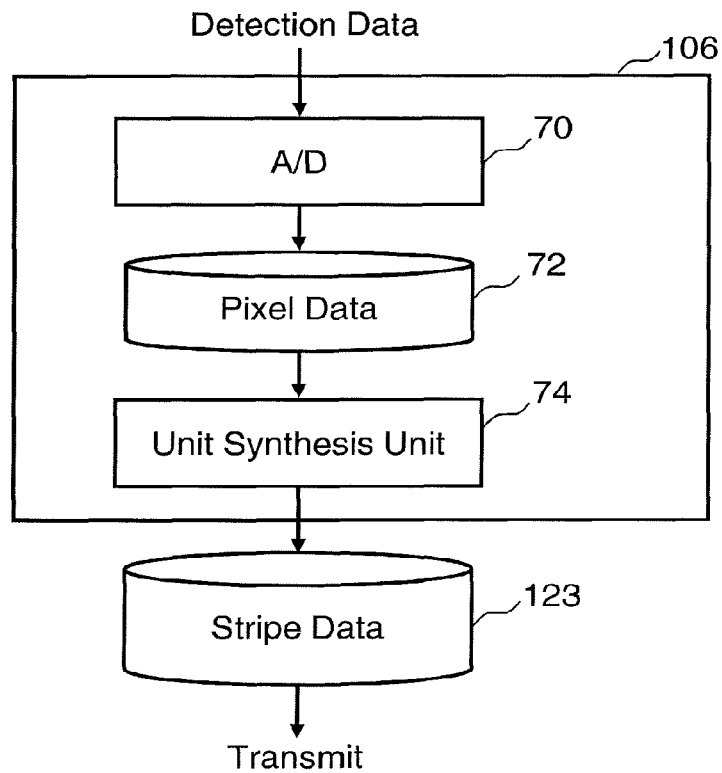
FIG. 2 shows an internal configuration of a detection circuit according to the first embodiment.

FIG. 2 shows an internal configuration of a detection circuit according to the first embodiment. In the detection circuit 106 of FIG. 2, an analog/digital converter 70, a storage device 72 which temporarily stores data, and a unit synthesis unit 74 are arranged. The unit synthesis unit 74 includes a processing circuitry. As the processing circuitry, for example, an electric circuit, computer, processor, circuit board, quantum circuit, semiconductor device, and the like can be used.

Figure 3:
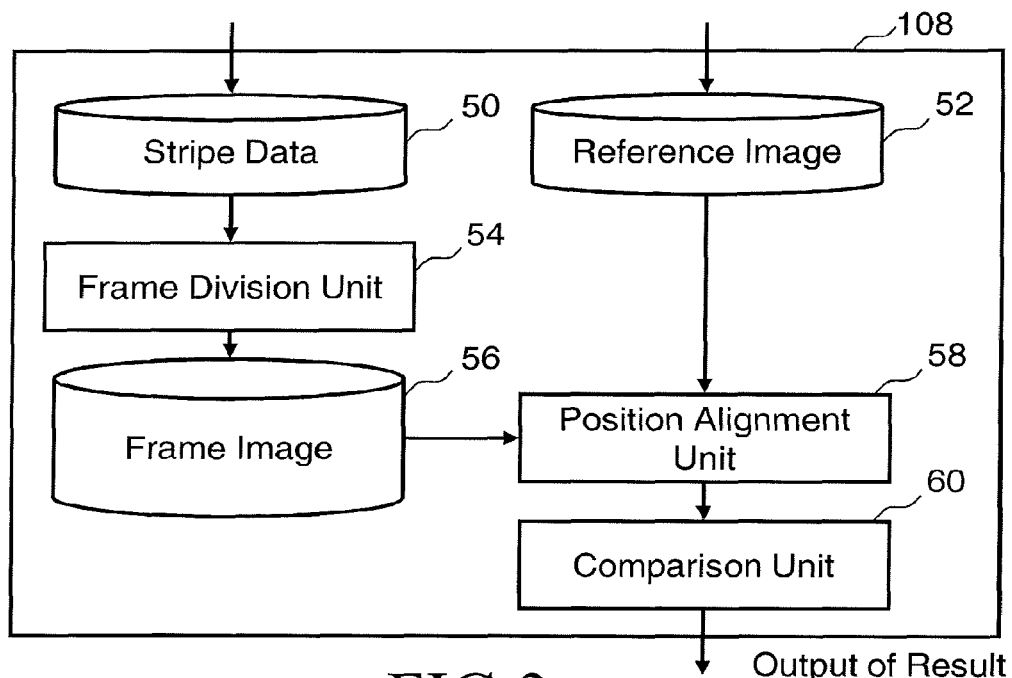
FIG. 3 shows an internal configuration of a comparison circuit according to the first embodiment.

FIG. 3 shows an internal configuration of a comparison circuit according to the first embodiment. In the comparison circuit 108 of FIG. 3, storage devices 50, 52, and 56, such as magnetic disk drives, a dividing unit 54 for dividing into frames, a position alignment unit 58, and a comparison unit 60 are arranged. Each " . . . unit" includes a processing circuitry. As the processing circuitry, for example, an electric circuit, computer, processor, circuit board, quantum circuit, semiconductor device, and the like can be used. Each " . . . unit" may use a common processing circuitry (same processing circuitry), or different processing circuitries (separate processing circuitries).

Figure 4:
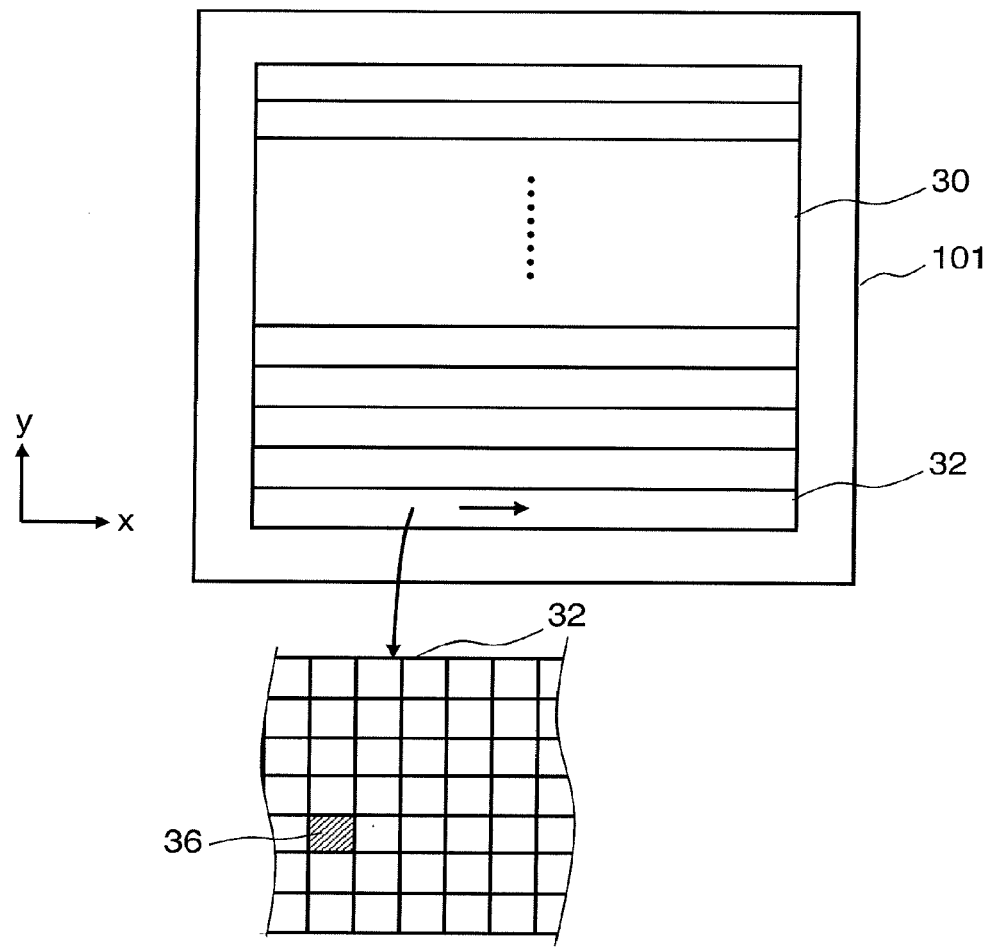
FIG. 4 is a conceptual diagram for explaining each region according to the first embodiment.

FIG. 4 is a conceptual diagram for explaining each region according to the first embodiment. In FIG. 4, an inspection region 30 of the substrate 101 is virtually divided by the width deflectable by the deflector 408 into a plurality of strip-shaped stripe regions 32 arrayed, for example, along the y direction. Further, each of the stripe regions 32 is virtually divided by the width deflectable by the deflector 408 into a plurality of regions arrayed along the x direction, each being a deflection region of the deflector 408. The deflection region, which is not formed at a fixed position on the stripe region 32, serves as a deflectable range of electron beams from the electron optical column 302 side. Therefore, with the movement of the XY stage 305, the deflection region relatively moves on the stripe region 32 to be inspected. For example, each stripe region 32 is virtually divided into a plurality of measurement pixels 36 by the same size as the beam diameter of the electron beam 400 irradiating the substrate 101. Each measurement pixel 36 serves as an irradiation unit region irradiated with the electron beam 400.

In the scanning step, while moving the XY stage 305 continuously or in a step and repeat operation, the optical image acquisition mechanism 150 delivers shots of the electron beam 400 in order onto a column of the measurement pixels 36 arrayed in the y direction in the stripe region 32 to be inspected, and detects, in order, the secondary electron 300 emitted from each measurement pixel 36. Movement of the deflection position of the electron beam 400 between each shot may be performed by deflecting the electron beam 400 by the deflector 408. After finishing shots of one pixel column, shots will be similarly performed to a next pixel column of measurement pixels 36 which adjoins in the x direction. By repeating this operation, a shot of the electron beam 400 is delivered to all the measurement pixels 36 of the stripe region 32 to be inspected in order to detect a secondary electron of each measurement pixel 36. When performing a step and repeat operation, it is sufficient to move between each region obtained by dividing the stripe region 32 in the x direction by the width deflectable by the deflector 408, for example. Although the shot is always performed in one direction (y direction) in order in the example of FIG. 4, it is not limited thereto. After performing shots of one pixel column in the y direction in order, it is also preferable to perform shots in order in the −y direction to an adjacent next pixel column, to be in a zigzag direction.

Moreover, although the shot of the electron beam 400 is separated for each measurement pixel 36, it is not limited thereto. When performing a zigzag progress, it is also preferable to deliver the electron beam 400 by a raster scan method.

Detection data of the secondary electron 300 of each measurement pixel 36 detected by the detector 422 as described above is output to the detection circuit 106 in order of measurement. In the detection circuit 106, the detection data being analog data is converted into digital data by the A/D converter 70, and stored in the storage device 72.

Figure 5:
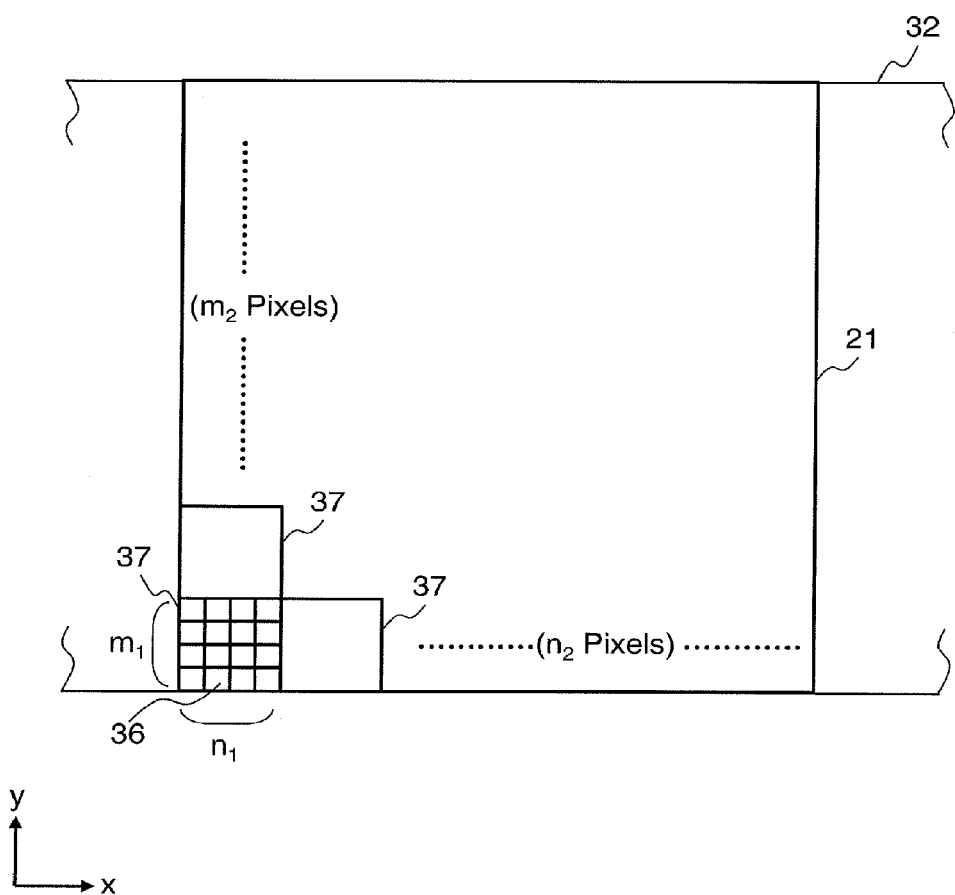
FIG. 5 illustrates a measurement region and an inspection region according to the first embodiment.

FIG. 5 illustrates a measurement region and an inspection region according to the first embodiment. Each stripe region 32 is divided in the x direction by the width deflectable by the deflector 408 into a plurality of measurement image regions 21 to be inspected. Each measurement image region 21 is divided into two-dimensional $n_2 \times m_2$ inspection pixels 37 (image reference region), where one of $n_2$ and $m_2$ is an integer of 1 or more and the other is an integer of 2 or more. Each inspection pixel 37 is composed of two-dimensional $n_1 \times m_1$ measurement pixels 36, where one of $n_1$ and $m_1$ is an integer of 1 or more and the other is an integer of 2 or more. It is supposed that the measurement image region 21 is, for example, an 8×8 μm square in the x and y directions (two-dimensional), and the measurement pixel 36 is, for example, a 2×2 nm square in the x and y directions (two-dimensional). In such a case, 4000×4000 measurement pixels 36 are arranged in the x and y directions (two-dimensional) in one measurement image region 21. When the inspection pixel 37 is composed of, for example, 4×4 measurement pixels 36 in the x and y directions (two-dimensional), 1000×1000 inspection pixels 37 are arranged in the x and y directions (two-dimensional) in one measurement image region 21. Although the case of the inspection pixel 37 being composed of 4×4 measurement pixels 36 in the x and y directions (two-dimensional) is shown in the example of FIG. 5, it is not limited thereto. It may be composed of fewer measurement pixels 36, or more measurement pixels 36. However, if the size of the inspection pixel 37 exceeds 50 times the beam diameter size (size of the measurement pixel 36) of an electron beam, there is a possibility of exceeding a practical limit of pattern inspection to be described later. Therefore, the inspection pixel 37 is preferably composed of 50×50 or less than 50×50 measurement pixels 36 in the x and y directions (two-dimensional). Thereby, the size of the inspection pixel 37 can be suppressed to be less than 50 times the beam diameter size (size of the measurement pixel 36) of an electron beam. If a defect size of the substrate 101 to be inspected is 2 nm, for example, the beam diameter size (size of the measurement pixel 36) of an electron beam should be set to 2 nm. In such a case, the size of the inspection pixel 37 should be set to be within 100 nm.

As shown in FIG. 5, the inspection region 30 of the substrate 101, in which a plurality of figure patterns are formed, is virtually divided into a plurality of strip-shaped stripe regions 32 by the width size of a line of $m_1 \times m_2$ measurement pixels 36 long. Then, the detector 422 inputs detection data for each measurement pixel 36 in order from the $m_1 \times m_2$ measurement pixels 36 which are arranged in the short width direction (y direction) of the stripe region 32 concerned in accordance with the shift order of the electron beam 400.

The unit synthesis unit 74 (data processing unit) inputs detection data (digital data) for each measurement pixel 36 irradiated with the electron beam 400 from the storage device 72. Then, the unit synthesis unit 74 calculates, for each two-dimensional inspection pixel 37, a statistic value acquired from detection data of all the measurement pixels 36 in the inspection pixel 37 concerned. For example, an average value of signal strength is calculated. Alternatively, a maximum value, a minimum value, or a combined value of these values is calculated. The unit synthesis unit 74 defines, for each inspection pixel 37, a corresponding statistic value as image reference data (pixel value for inspection). Thus, the unit synthesis unit 74 synthesizes a plurality of measurement pixels 36 which are two-dimensionally adjacent to one another, as one inspection pixel 37. A measurement image of the measurement image region 21 concerned is configured by image reference data (pixel value for inspection) of all the inspection pixels 37 in the measurement image region 21. The image reference data of each inspection pixel 37 is stored in the stripe pattern memory 123, in units of the stripe region 32, for example.

The image reference data of each inspection pixel 37 accumulated in the stripe pattern memory 123 is transmitted to the comparison circuit 108, for example, through an optical fiber cable 121. It is preferable that image reference data of each inspection pixel 37 is transmitted in units of the stripe regions 32, for example. Alternatively, image reference data of each inspection pixel 37 may be transmitted in units of the measurement image region 21.

FIGS. 6A and 6B illustrate transmission processing and a data amount according to the first embodiment. FIG. 6A shows the case, as a comparative example to the first embodiment, where data of the measurement pixel 36 is transmitted as it is to the comparison circuit 108 through the optical fiber cable 121. FIG. 6B shows the case, as the first embodiment, where data of the inspection pixel 37 acquired by synthesizing a plurality of two-dimensional adjacent measurement pixels 36 is transmitted to the comparison circuit 108 through the optical fiber cable 121. As described above, it is supposed that the measurement image region 21 is, for example, an 8×8 µm square in the x and y directions (two-dimensional), and the measurement pixel 36 is, for example, a 2×2 nm square in the x and y directions (two-dimensional). In such a case, 4000×4000 measurement pixels 36 are arranged in the x and y directions (two-dimensional) in one measurement image region 21. When the signal strength of one measurement pixel 36 is defined by 256 gray levels, data capacity required for measurement data of one measurement pixel 36 is 1 byte (=8 bits). Therefore, data capacity of 4000×4000 bytes=16 Mbytes is needed for a measurement image of one measurement image region 21. Thus, as shown in FIG. 6A, the amount of pixel data becomes large, and transmission takes time. By contrast, according to the first embodiment, when the inspection pixel 37 is configured by, for example, 4×4 measurement pixels 36 in the x and y directions (two-dimensional), 1000×1000 inspection pixels 37 are arranged in the x and y directions (two-dimensional) in one measurement image region 21. Therefore, data capacity of a measurement image of one measurement image region 21 can be 1000×1000 bytes=1 Mbytes. Accordingly, as shown in FIG. 6B, the amount of pixel data can be small, and transmission time can be reduced. In the example described above, the data amount can be reduced to 1/16. If the number of the measurement pixels 36 configuring the inspection pixel 37 is further increased, the data amount can be greatly reduced. When the inspection pixel 37 is composed of, for example, 50×50 measurement pixels 36 in the x and y directions (two-dimensional), the data amount can be reduced to 1/2500.

The image reference data of each inspection pixel 37 having been transmitted to the comparison circuit 108 is stored in the storage device 50 in units of the stripe region 32. At this time, the data has become an image of each stripe region 32. The stripe region image is divided in the x direction into a plurality of measurement image regions 21 by the width being the same as that of the inspection stripe 32.

In a dividing step for dividing into frames, the dividing unit 54 for dividing into frames divides a stripe region image into measurement images (frame images) of a plurality of measurement image regions 21 in the x direction by the width being the same as that of the inspection stripe 32. The measurement image of each measurement image region 21 is stored in the storage device 56.

In a reference image generation step, when the substrate 101 is an exposure mask, a reference image generation unit, such as the development circuit 111 and the reference circuit 112, generates a reference image of the region corresponding to a measurement image (optical image) of the measurement image region 21, based on writing data (design data) serving as a basis for forming a plurality of figure patterns on the substrate 101. When the substrate 101 is a semiconductor substrate, the reference image generation unit, such as the expansion circuit 111 and the reference circuit 112, generates a reference image of the region corresponding to a measurement image (optical image) of the measurement image region 21, based on exposure image data which defines an exposure image on the substrate for exposure-transferring a mask pattern of an exposure mask onto the semiconductor substrate. Here, a plurality of reference images (design images) corresponding to a plurality of measurement image regions 21 are generated. Specifically, it operates as described below. First, the development circuit 111 reads writing data (or exposure image data) from the magnetic disk drive 109 through the control computer 110, converts each figure pattern in each measurement image region 21 defined in the writing data (or exposure image data) having been read into image data of binary values or multiple values, and transmits the image data to the reference circuit 112.

Here, basics of figures defined in the writing data (or exposure image data) are, for example, rectangles or triangles. The writing data (or exposure image data) includes figure data which defines the shape, size, position, and the like of each pattern figure by using information, such as coordinates (x, y) of the reference position of a figure, lengths of sides of the figure, and a figure code serving as an identifier for identifying the figure type, namely a rectangle, a triangle and the like.

When the writing data (or exposure image data), used as figure data, is input to the development circuit 111, the data is developed into data of each figure. Then, the figure code, figure dimensions and the like indicating the figure shape in the figure data are interpreted. Then, the development circuit 111 develops design image data of binary values or multiple values as a pattern to be arranged in a square in units of a grid of predetermined quantization dimensions and outputs the developed data. In other words, the development circuit 111 reads design data, calculates the occupancy rate occupied by figures in a design pattern for each grid obtained by virtually dividing an inspection region into grids in units of predetermined dimensions, and outputs n-bit occupancy rate data. For example, it is preferable that one grid is set as one pixel. If one pixel has a resolution of $1/2^8$ (=1/256), 1/256 small regions are allocated to the region of figures arranged in a pixel in order to calculate the occupancy rate in the pixel. Then, it is output, as 8-bit occupancy rate data, to the reference circuit 112. The grid preferably has the same size as the inspection pixel 37.

The reference circuit 112 performs appropriate filter processing on the design image data being transmitted image data of a figure. Since the measurement data as an optical image obtained from the detection circuit 106 is in the state affected by the filtering by the electron optical system, in other words, in the analog state continuously changing, it is possible to match the design image data with the measurement data by also performing filter processing on the design image data being image data on the design side having image intensity (gray value) represented by digital values. In this manner, a design image (reference image) to be compared with a measurement image (optical image) of the measurement image region 21 is generated. The generated reference image is input into the comparison circuit 108 to be stored in the memory 52.

As described above, a plurality of reference images of a plurality of figure patterns in accordance with a plurality of measurement image region 21 are generated based on design data which defines a plurality of figure patterns for each of a plurality of measurement image region 21 having different positions. Thereby, a plurality of reference images are generated to be corresponding to measurement images of a plurality of measurement image regions 21 in each inspection stripe 32 detected from the substrate 101.

In a position adjustment step, a position adjustment unit 58 reads a measurement image (optical image) of the measurement image region 21 to be compared from the storage device 56, and a reference image to also be compared from the storage device 52. Then, position adjustment is performed based on a predetermined algorithm. For example, the position adjustment is performed using a least-squares method.

In a comparison step, the comparison unit 60 compares, for each inspection pixel 37, a measurement image with a reference image, using a reference image corresponding to the measurement image of the measurement image region 21 composed of $n_2 \times m_2$ inspection pixels 37. Specifically, the comparison unit 60 compares a measurement image and a reference image for each inspection pixel 37, based on predetermined determination conditions in order to determine whether there is a defect, such as a shape defect. For example, if a gradation value difference of each inspection pixel 37 is larger than a determination threshold, it is determined that there is a defect. Then, the comparison result is output, and specifically output to the storage device 109, monitor 117, or memory 118, or from printer 119.

FIG. 7 shows an example of pattern detection in an inspection pixel according to the first embodiment. Since the data acquired for each measurement pixel 36 is synthesized to be the inspection pixel 37 in the first embodiment, there is an issue of inspection sensitivity. However, according to the first embodiment, a figure pattern smaller than the inspection pixel 37 can also be detected as described below. When gradation values of the three adjacent inspection pixels 37a, 37b, and 37c are 20, 80, and 20, for example, the sum of the three sum is 120. Supposing that one inspection pixel 37 is defined by 256 gray levels, 120 gray levels are equivalent to about 0.5 pixel. Therefore, if the size of one inspection pixel 37 is 50 nm, for example, a figure indicated by the three adjacent inspection pixels 37a, 37b, and 37c can be recognized as a figure pattern 38 with a line width of 25 nm being ½ of 50 nm. The inspection pixels 37a and 37c being both sides of the central inspection pixel 37b are the same gradation values and smaller than that of the inspection pixel 37b. Therefore, it can be presumed that the figure pattern 38 with the line width of 25 nm is formed at the center of the central inspection pixel 37b as shown in FIG. 7. Accordingly, even when data acquired for each measurement pixel 36 is synthesized to be the inspection pixel 37, a figure pattern smaller than the inspection pixel 37 can be detected. Thus, defects can be detected by comparing a measurement image with a reference image for each inspection pixel 37.

With respect to the inspection pixel 37 which has been determined, as a comparison result, to be defective by the comparison circuit 108, it is desirable to review the inspection pixel 37 in detail in the detection circuit 106 using an image of detection data for each measurement pixel 36 before being synthesized. Then, according to the first embodiment, detection data (digital data) for each measurement pixel 36 to be irradiated with the electron beam 400 is temporarily stored in the buffer memory 125 of the detection circuit 106 to be accumulated therein. The accumulated data is saved until comparison processing is completed in the comparison circuit 108.

After completing the comparison processing, the comparison circuit 108 transmits information indicating whether to perform transmission or not to the buffer memory 125. In the buffer memory 125, whether to perform transmission or not is selected based on the transmitted information, and detection data of the measurement pixel 36 corresponding to the inspection pixel 37 which has been determined, as a comparison result, to be defective is transmitted to the comparison circuit 108. Then, the detection data of the measurement pixel 36 corresponding to the inspection pixel 37 determined to be defective, which has been stored in the buffer memory 125, is deleted. Alternatively, in the buffer memory 125, detection data of the measurement pixel 36 which is not needed to be transmitted is deleted. The transmitted detection data of each transmitted measurement pixel 36 is stored in the storage device 109 through the comparison circuit 108. Then, under the control of the control computer 110, the monitor 117 displays an image of the inspection pixel 37 having been determined to be defective, by using detection data of the measurement pixel 36 corresponding to the inspection pixel 37 having been determined to be defective. Details of a defective portion can be reviewed by visual contact with the image by a user.

As described above, according to the first embodiment, even when the diameter of the electron beam 400 is small, the amount of data configuring the measurement image of the measurement image region 21 can be small. Also, the amount of data configuring a corresponding reference image can be small. Therefore, it is possible to realize the pattern inspection apparatus 100 that can perform data transmission and data processing without mounting therein fairly large-scale processors which are unrealistic.

Second Embodiment

In the first embodiment, an electron beam inspection apparatus of the single beam type has been described, but it is not limited thereto. In the second embodiment, an electron beam inspection apparatus of the multi-beam type will be described.

Figure 8:
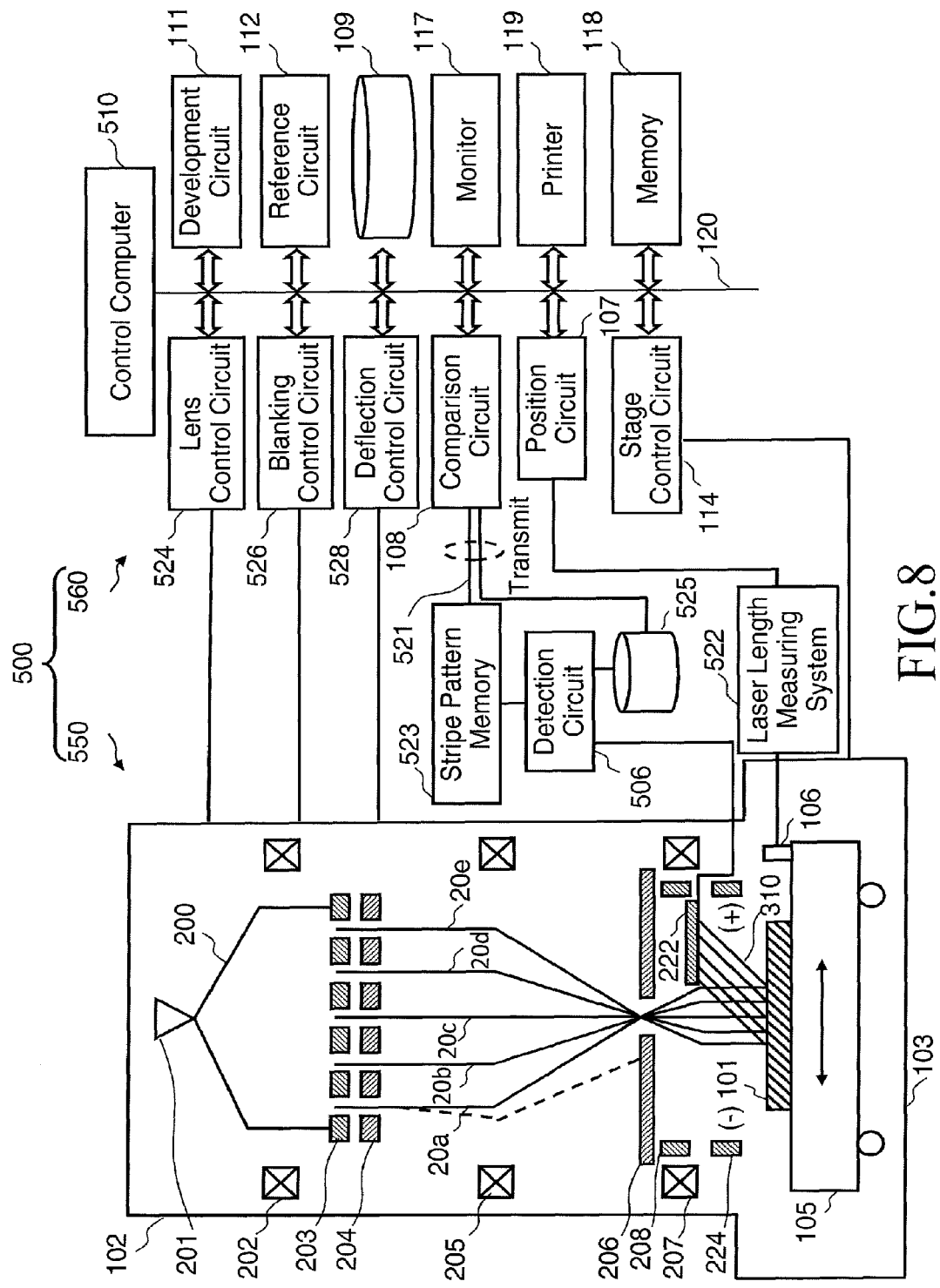
FIG. 8 is a conceptual diagram showing a configuration of a pattern inspection apparatus according to a second embodiment.

FIG. 8 is a conceptual diagram showing a configuration of a pattern inspection apparatus according to the second embodiment. The inspection apparatus 500 of FIG. 8 includes an optical image acquisition mechanism 550 and a control system circuit 560 (control unit). The inspection apparatus 500 is an example of a multi-electron beam inspection apparatus. The optical image acquisition mechanism 550 includes an electron beam column 102 (electron optical column), an inspection chamber 103, a detection circuit 506, a stripe pattern memory 523, a buffer memory 525, and a laser length measuring system 522. In the electron beam column 102, there are arranged an electron gun 201, an illumination lens 202, a forming aperture array member 203, a blanking aperture array unit 204, a reducing lens 205, a limiting aperture member 206, an objective lens 207, a deflector 208, a deflector 224, and a detector 222.

In the inspection chamber 103, there is arranged an XY stage 105 which is movable at least in the x-y directions. On the XY stage 105, there is placed the substrate 101 on which a plurality of figure patterns serving as inspection targets are formed. The substrate 101 may be an exposure mask or a semiconductor substrate such as a silicon wafer as described above. The substrate 101 is placed, with its pattern forming surface facing upward, for example, on the XY stage 105. On the XY stage 105, there is arranged a mirror 106 which reflects a laser beam for measuring a laser length emitted from the laser length measuring system 522 arranged outside the inspection chamber 103. The detector 222 is connected at the outside of the electron beam column 102 to the detection circuit 506. The detection circuit 506 is connected to the stripe pattern memory 523.

In the control system circuit 560, a control computer 510 is connected, through the bus 120, to the position circuit 107, the comparison circuit 108, the development circuit 111, the reference circuit 112, the stage control circuit 114, a lens control circuit 524, a blanking control circuit 526, a deflection control circuit 528, the storage device 109 such as a magnetic disk drive, etc., the monitor 117, the memory 118, and the printer 119. The stripe pattern memory 523 is connected to the comparison circuit 108. The XY stage 105 is driven by the stage control circuit 114 under the control of the control computer 510. The XY stage 105 can be moved by a drive system such as a three-axis (X, Y, and θ) motor, which drives the stage in the directions of x, y, and θ. For example, a step motor can be used as each of these X, Y, and θ motors (not shown). The XY stage 105 is movable in the horizontal direction and the rotation direction by the motors of the X-, Y-, and θ-axis. The movement position of the XY stage 105 is measured by the laser length measuring system 522, and supplied to the position circuit 507. The laser length measuring system 522 measures the position (length) of the XY stage 105 by receiving a catoptric light from the mirror 106 based on the principle of laser interferometry.

A high voltage power supply circuit (not shown) is connected to the electron gun 201. The high voltage power supply circuit applies an acceleration voltage between the cathode and the anode (not shown) in the electron gun 201. By applying this acceleration voltage and a predetermined bias voltage, and by heating the cathode at a predetermined temperature, electrons emitted from the cathode are accelerated to become electron beams to be discharged. For example, electron lenses are used as the illumination lens 202, the reducing lens 205, and the objective lens 207, all of which are controlled by the lens control circuit 524. In the blanking aperture array unit 204, there are arranged a plurality of individual blanking mechanisms to be described later, and a control signal to each individual blanking mechanism is output from the blanking control circuit 526. The deflector 208 is configured by at least four electrodes, and controlled by the deflection control circuit 528. The deflector 224 is configured by at least two electrodes, and controlled by the deflection control circuit 528.

In the case of the substrate 101 being an exposure mask, when a plurality of figure patterns are formed on the exposure mask by a writing apparatus (not shown), such as an electron beam writing apparatus, writing data used by the writing apparatus is input to the inspection apparatus 500 from the outside, and stored in the storage device 109. In the case of the substrate 101 being a semiconductor substrate, exposure image data, which defines an exposure image to be formed on the semiconductor substrate when a mask pattern of the exposure mask is exposure transferred to the semiconductor substrate, is input into the inspection apparatus 500 from the outside, and stored in the storage device 109. The exposure image data may be generated by a space image capturing device (not shown), for example.

FIG. 8 shows configuration elements necessary for describing the second embodiment. It should be understood that other configuration elements generally necessary for the writing apparatus 500 may also be included therein.

Figure 9:
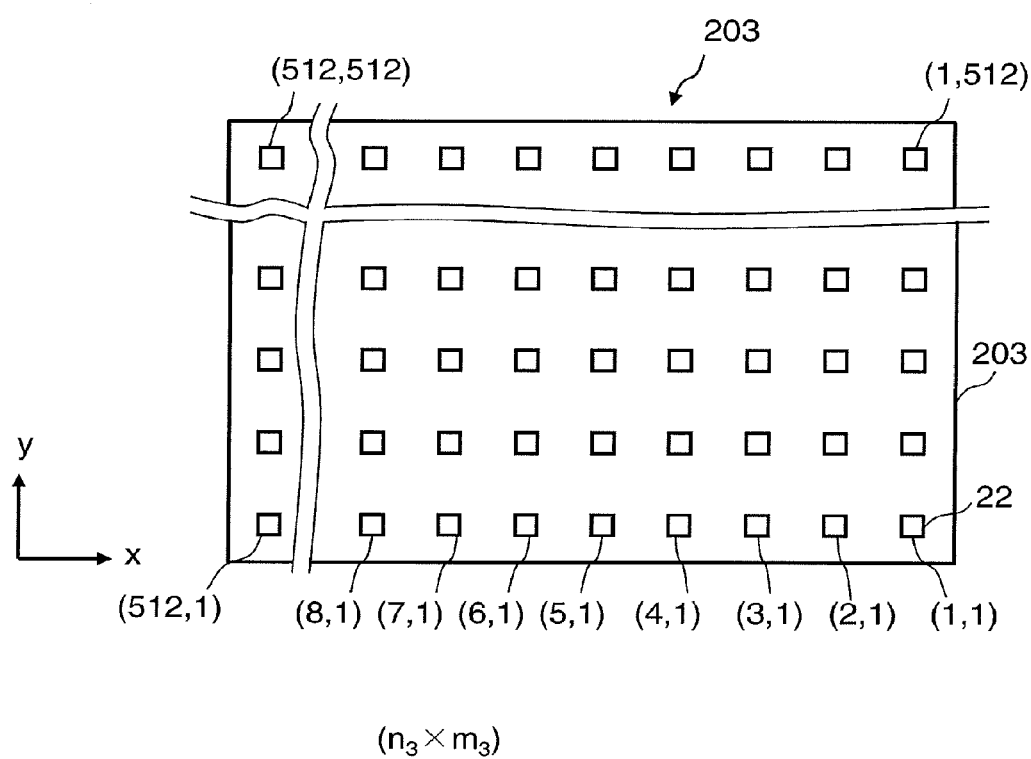
FIG. 9 is a conceptual diagram showing a configuration of a forming aperture array member according to the second embodiment.

FIG. 9 is a conceptual diagram showing a configuration of a forming aperture array member according to the second embodiment. As shown in FIG. 9, holes (openings) 22 of $n_3$ columns wide (x direction) and $m_3$ rows long (y direction) are formed, like a matrix, at a predetermined arrangement pitch in the forming aperture array member 203, where one of $n_3$ and $m_3$ is an integer of 1 or more and the other is an integer of 2 or more. In FIG. 9, for example, holes 22 of 512 (columns in x direction)×512 (rows in y direction) are formed. Each of the holes 22 is a quadrangle of the same dimensional shape. Alternatively, each of the holes 22 can be a circle of the same circumference. Multi-beams 20 are formed by letting portions of an electron beam 200 individually pass a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 9 where holes are arranged like a grid in the width and length directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b".

Figure 10:
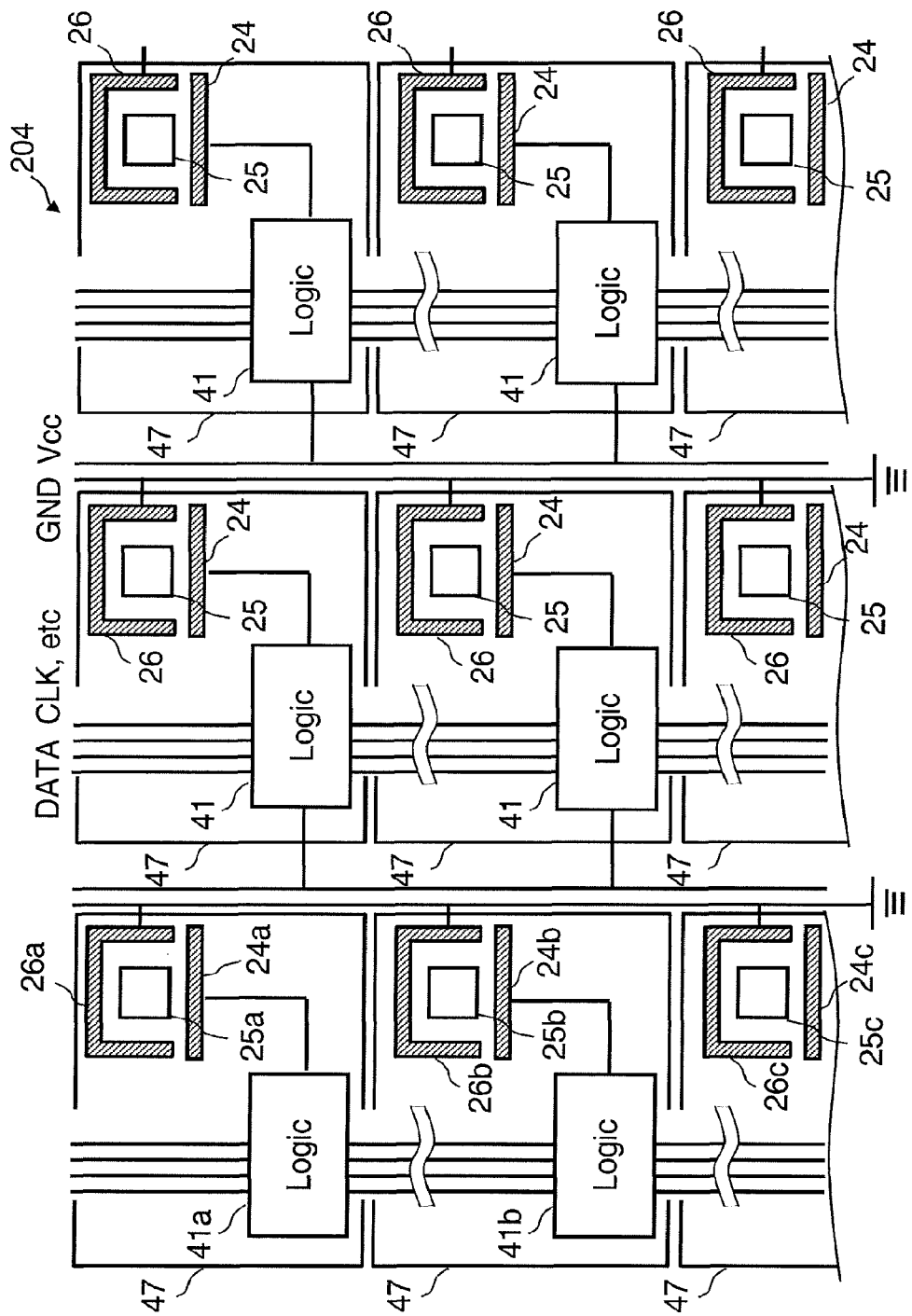
FIG. 10 is a top view conceptual diagram showing a part of a blanking aperture array unit according to the second embodiment.

FIG. 10 is a top view conceptual diagram showing a part of a blanking aperture array unit according to the second embodiment. In FIG. 10, the positional relation of electrodes 24 and 26 and the positional relation of a control circuit 41 are not in accordance with each other. As shown in FIG. 10, in the blanking aperture array unit 204, there are formed passage holes 25 (openings), through which multiple beams individually pass, at the positions each corresponding to each hole 22 of the forming aperture array member 203 of FIG. 9. Then, a pair of electrodes 24 and 26 (blanker: blanking deflector) for blanking deflection is arranged close to each passage hole 25 in a manner such that the electrodes 24 and 26 are opposite each other with respect to the passage hole 25 concerned. Moreover, close to each passage hole 25, there is arranged the control circuit 41 (logic circuit) for applying a deflection voltage to, for example, the electrode 24 for each passage hole 25. The other one (the electrode 26, for example) of the two electrodes 24 and 26 for each beam is connected to the ground (earthed). Further, for example, 1-bit line for control signal is connected to each control circuit 41. In addition to the 1-bit line, for example, a clock signal line, a power source line, and the like are connected to each control circuit 41. An individual blanking system 47 composed of the electrodes 24 and 26 and the control circuit 41 is configured for each beam of multi-beams. A control signal for each control circuit 41 is output from the blanking control circuit 526. Moreover, a shift register (not shown) is arranged in each control circuit 41, and for example, shift registers for beams in one row of $n_3 \times m_3$ multi beams in the control circuit are connected in series. For example, control signals for beams in one row of the $n_3 \times m_3$ multi beams are transmitted in series. For example, a control signal of each beam is stored in a corresponding control circuit 41 by clock signals of $n_3$ times.

The electron beam 20 passing through a corresponding passage hole is independently deflected by the voltage applied to the two electrodes 24 and 26 being a pair. Blanking control is performed by this deflection. Blanking deflection is performed for each corresponding beam of the multi-beams. Thus, each of a plurality of blankers performs blanking deflection of a corresponding beam of the multi-beams having passed through a plurality of holes 22 (openings) of the forming aperture array member 203.

Next, operations of the optical image acquisition mechanism 550 in the inspection apparatus 500 will be described. The electron beam 200 emitted from the electron gun 201 (emitter) almost perpendicularly (e.g., vertically) illuminates the whole of the forming aperture array member 203 by the illumination lens 202. A plurality of holes (openings) each being a quadrangle are formed in the forming aperture array member 203. The region including all the plurality of holes is irradiated by the electron beam 200. For example, a plurality of quadrangular electron beams (multi-beams) 20a to 20e are formed by letting portions of the electron beam 200, which irradiates the positions of a plurality of holes, individually pass through a corresponding hole of the plurality of holes of the forming aperture array member 203. The multi-beams 20a to 20e individually pass through corresponding blankers (first deflector: individual blanking mechanism) of the blanking aperture array unit 204. Each blanker deflects (performs blanking deflection) the electron beam 20 which is individually passing.

The multi-beams 20a to 20e having passed through the blanking aperture array unit 204 are reduced by the reducing lens 205, and go toward the hole in the center of the limiting aperture member 206. At this stage, the electron beam 20 which was deflected by the blanker of the blanking aperture array unit 204 deviates from the hole in the center of the limiting aperture member 206 and is blocked by the limiting aperture member 206. On the other hand, the electron beam 20 which was not deflected by the blanker of the blanking aperture array unit 204 passes through the hole in the center of the limiting aperture member 206 as shown in FIG. 8. Blanking control is performed by ON/OFF of the individual blanking mechanism so as to control ON/OFF of beams. Thus, the limiting aperture member 206 blocks each beam which was deflected to be in the OFF state by the individual blanking mechanism. Then, one shot beam of each beam is formed by a beam which has been made during a period from becoming beam ON to becoming beam OFF and has passed through the limiting aperture member 206. The multi-beams 20 having passed through the limiting aperture member 206 are focused by the objective lens 207 so as to be a pattern image of a desired reduction ratio, and respective beams (the whole of the multi-beams 20) having passed through the limiting aperture member 206 are collectively deflected in the same direction by the deflector 208 in order to irradiate respective beam irradiation positions on the substrate 101. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes of the forming aperture array member 203 by a desired reduction ratio described above. The writing apparatus 100 performs a scanning operation by irradiation of multi-beams 20 used as shot beams, along an inspection sequence controlled by the control computer 510, where each beam is shifted per pixel due to the movement of the beam deflection position by the deflector 208, while following the movement of the XY stage 105 during each tracking operation in the inspection sequence. Thus, the electron beam column 102 irradiates the substrate 101 with the two-dimensional $n_3 \times m_3$ multi-beams 20 at a time. A secondary electron group 310 being a bunch of the secondary electrons 300 each including a reflection electron corresponding to each beam of the multi-beams 20, emitted from the substrate 101 because the multi-beams 20 irradiate a desired position of the substrate 101, is deflected toward the detector 222 side by the deflector 224, and detected when being incident to the detector 222. The secondary electron group 310 has a smaller kinetic energy (motion energy) compared with the multi-beams 20 for irradiation. Therefore, the deflector 224 can deflect only the secondary electron group 310, which has a smaller kinetic energy than the multi-beams 20 for irradiation, by generating a weak electric field, without deflecting the multi-beams 20 for irradiation having been accelerated by a large acceleration voltage.

In the scanning step, while moving the XY stage 105 continuously or in a step and repeat operation, the optical image acquisition mechanism 550 delivers shots of the multi-beams 20 in order onto a plurality of measurement pixels 36 in an irradiation region 34 of the stripe region 32 to be inspected, and detects, in order, the secondary electron group 310 being a bunch of secondary electrons emitted from each measurement pixel 36.

Figure 11:
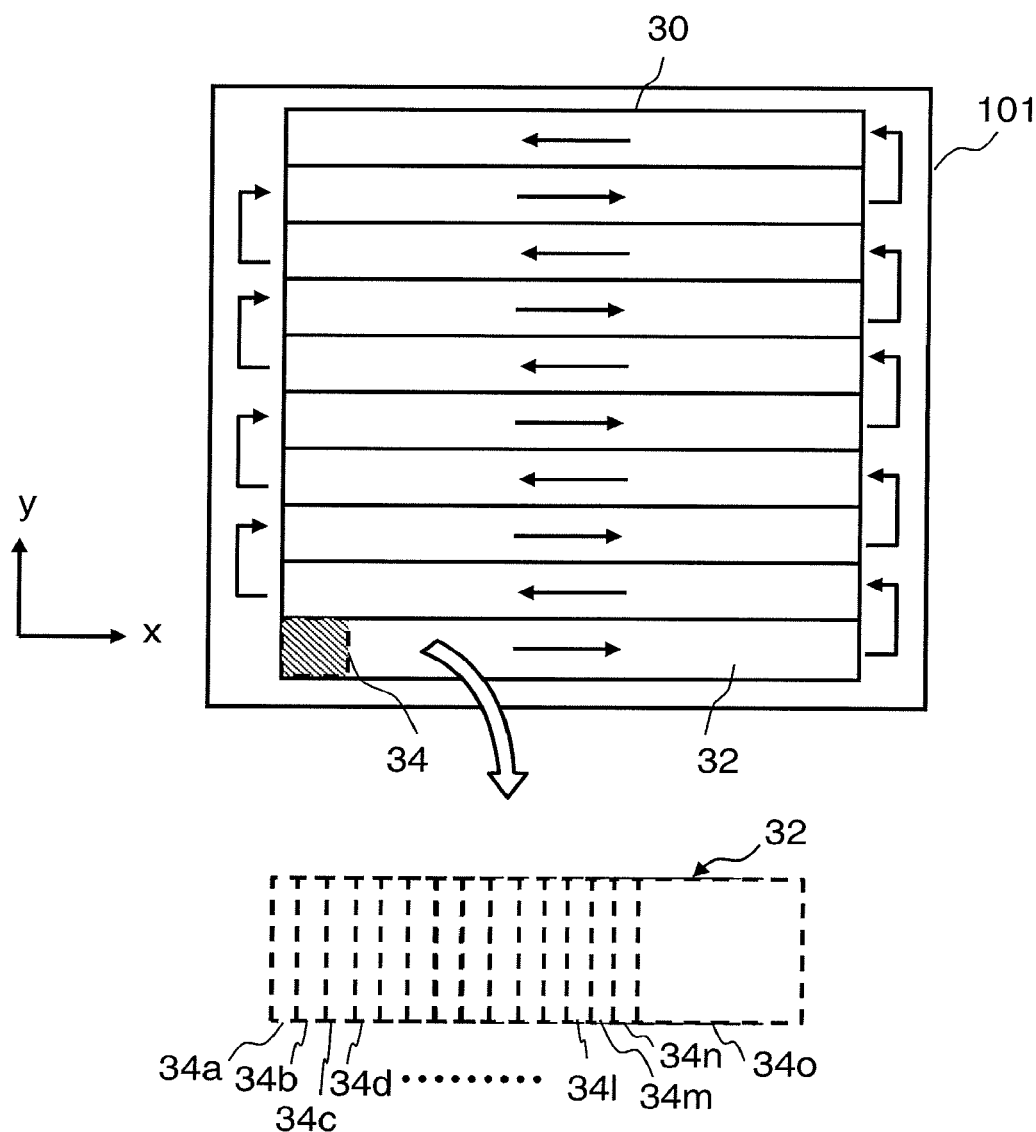
FIG. 11 is a conceptual diagram explaining an example of a scanning operation according to the second embodiment.

FIG. 11 is a conceptual diagram explaining an example of a scanning operation according to the second embodiment. As shown in FIG. 11, the inspection region 30 of the substrate 101 is virtually divided into a plurality of stripe regions 32 each in a strip shape and each having a predetermined width in the y direction, for example. First, the XY stage 105 is moved to make an adjustment such that the irradiation region 34 which can be irradiated with one irradiation of the multi-beams 20 is located at the left end of the first stripe region 32 or at a position more left than the left end, and then writing is started. When writing the first stripe region 32, the XY stage 105 is moved, for example, in the −x direction, so that the writing advances relatively in the x direction. The XY stage 105 is moved, for example, continuously at a constant speed. After completing the irradiation of the multi-beams for inspection to the first stripe region 32, the stage position is moved in the −y direction to make an adjustment such that the irradiation region 34 is located at the right end of the second stripe region 32 or at a position more right than the right end and located relatively in the y direction. Then, by moving the XY stage 105 in the x direction, for example, multi-beam irradiation advances in the −x direction. That is, scanning is performed while alternately changing the direction, such as performing the multi-beam irradiation in the x direction in the third stripe region 32, and in the −x direction in the fourth stripe region 32, and thus, the inspection time can be reduced. However, the scanning operation is not limited to the case of performing scanning while alternately changing the direction, and it is also preferable to perform scanning in the same direction when writing each stripe region 32. The secondary electron group 310 being a bunch of secondary electrons corresponding to a plurality of shots equal to the number of the holes 22 at the maximum is detected at a time by one shot of multi-beams which were formed by being passed through each of the holes 22 of the forming aperture array member 203.

Figure 12:
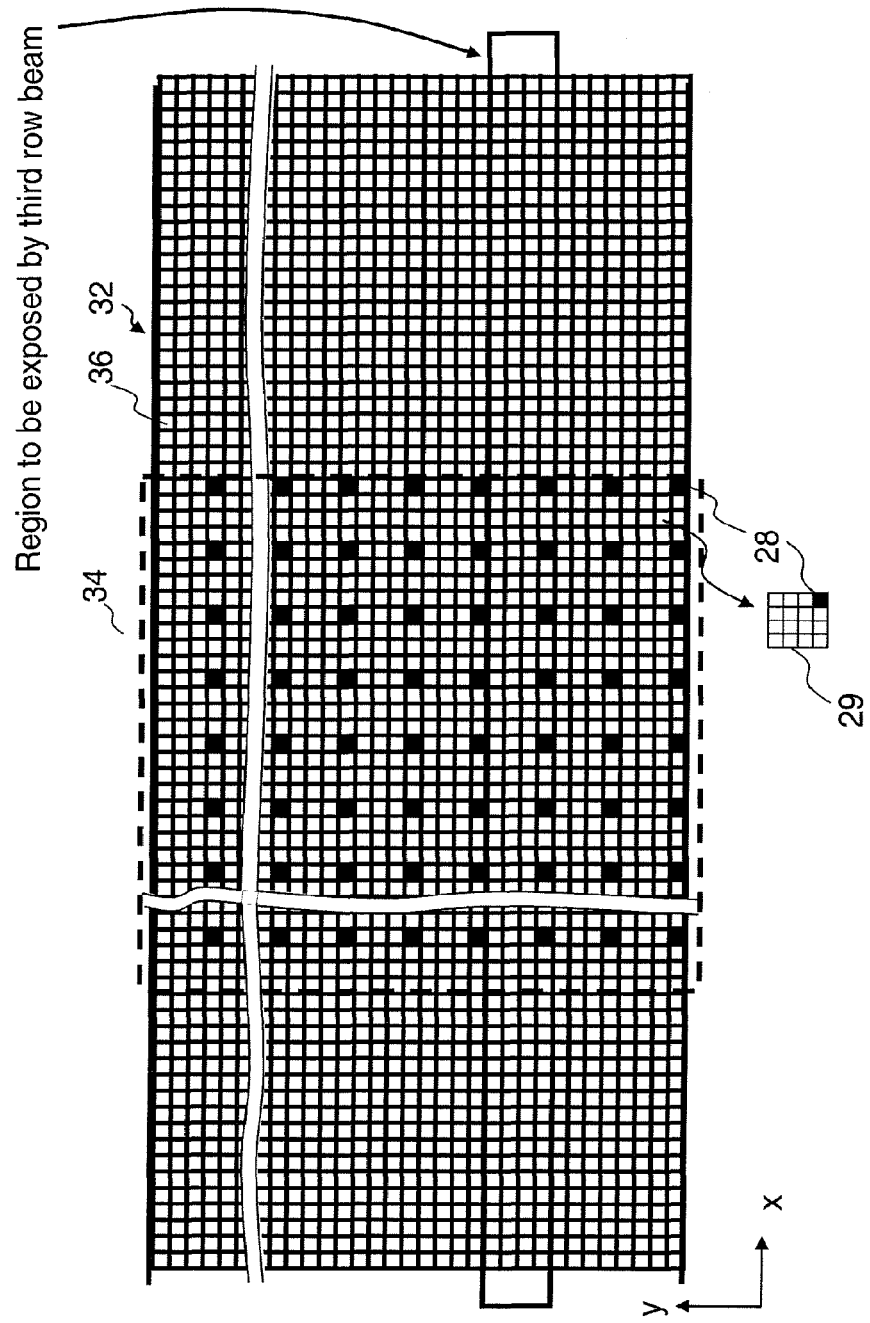
FIG. 12 shows an example of an irradiation region of multi-beams and a measurement pixel 36 according to the second embodiment.

FIG. 12 shows an example of an irradiation region of multi-beams and a measurement pixel 36 according to the second embodiment. In FIG. 12, the stripe region 32 is divided into a plurality of mesh regions by the size of the whole multi-beams, for example. Each mesh region serves as a measurement pixel 36 (unit irradiation region). FIG. 12 shows the case where the inspection region of the substrate 101 is divided in the y direction into a plurality of stripe regions 32 by the width size being substantially the same as the size of the irradiation region 34 (writing field) which can be irradiated with one irradiation of the multi-beams 20, for example. The width of the stripe region 32 is not limited to this. It is also preferable for the width of the stripe region 32 to be $n_4$ times ($n_4$ being an integer of 1 or more) the size of the irradiation region 34. FIG. 12 shows the case of multi-beams of 512×512 (rows by columns). In the irradiation region 34, there are shown a plurality of measurement pixels 28 (irradiation position of beam of one shot) which can be irradiated with one irradiation of the multi-beams 20. In other words, the pitch between the adjacent measurement pixels 28 is the pitch between beams of the multi-beams. In the example of FIG. 12, one grid 29 is a square region surrounded at four corners by four adjacent measurement pixels 28, and including one of the four measurement pixels 28. In the example of FIG. 12, each grid 29 is configured by 4×4 pixels.

Figure 13:
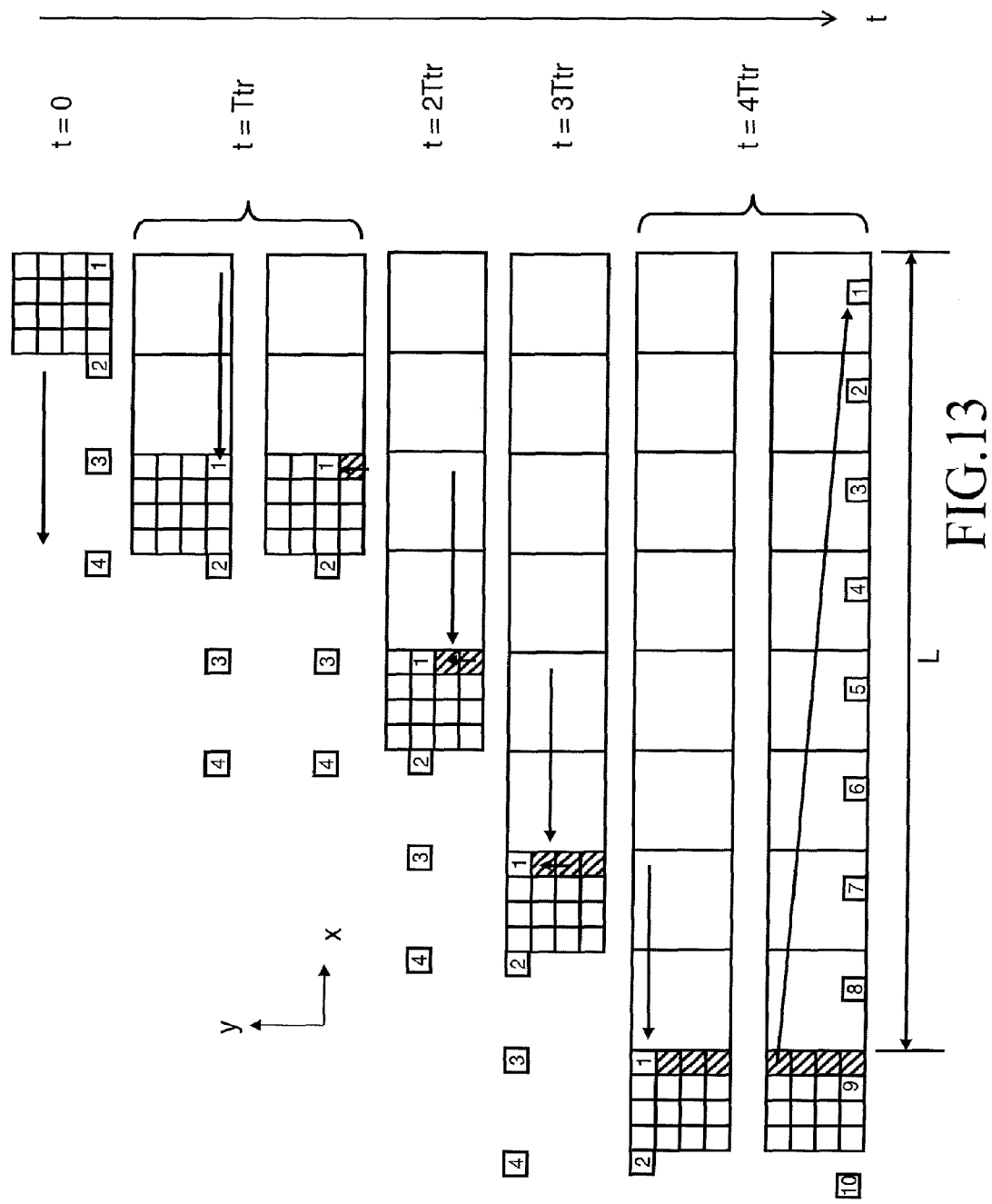
FIG. 13 illustrates an example of a writing method of multi-beams according to the second embodiment.

FIG. 13 illustrates an example of a writing method of multi-beams according to the second embodiment. FIG. 13 shows some grids to be irradiated by respective beams at the coordinates (1, 3), (2, 3), (3, 3), . . . , (512, 3) in the third row from the bottom in the multi-beams for irradiating the stripe region 32 shown in FIG. 12. In the example of FIG. 13, while the XY stage 105 moves the distance of eight beam pitches, four measurement pixels 36 are irradiated, for example. In order that the relative position between the irradiation region 34 and the substrate 101 may not shift by the movement of the XY stage 105 while these four measurement pixels are irradiated, the irradiation region 34 is made to follow the movement of the XY stage 105 by collectively deflecting the entire multi-beams 20 by the deflector 208. In other words, tracking control is performed. In the example of FIG. 13, one tracking cycle is executed by irradiating four measurement pixels 36 while moving the distance of eight beam pitches.

Specifically, the laser length measuring system 522 measures the position of the XY stage 105 by irradiating the mirror 106 with a laser and receiving a catoptric light from the mirror 106. The measured position of the XY stage 105 is output to the position circuit 107. The position circuit 107 outputs the position information on the XY stage 105 to the deflection control circuit 528. The deflection control circuit 528 calculates deflection amount data (tracking deflection data) for performing beam deflection to follow the movement of the XY stage 105. The tracking deflection data being a digital signal is output to a digital/analog converter (DAC) amplifier. The DAC amplifier converts the digital signal to an analog signal and amplifies it to be applied as a tracking deflection voltage to the main deflector 208.

The optical image acquisition mechanism 550 irradiates each measurement pixel 36 with a corresponding beam of the multi-beams 20 during the irradiation time of each beam in the shot concerned of the multi-beams. Operations of each shot according to the second embodiment is described below.

In the example of FIG. 13, during from the time t=0 to t=Ttr, using a beam (1) of coordinates (1, 3), beam irradiation of the first shot is performed to the first pixel from the right in the bottom row of the grid 29 concerned ("target grid", or "grid of interest"). The XY stage 105 moves, for example, two beam pitches in the −x direction during from the time t=0 to t=Ttr. During this time period, the tracking operation is continuously performed.

After the irradiation time Ttr of a shot has passed since the start of beam irradiation, while beam deflection for tracking control is being continuously performed by the deflector 208, the irradiation position (previous irradiation position) of each beam is shifted to a next irradiation position (current irradiation position) of each beam by collectively deflecting the multi-beams 20 by the deflector 208, which is performed in addition to the beam deflection for tracking control. In the example of FIG. 13, when the time becomes t=Ttr, the measurement pixel 36 to be irradiated is shifted (changed) from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continuously performed, respective corresponding beams of the multi-beams 20 are applied to shifted (changed) irradiation positions of the respective beams during the irradiation time Ttr of the shot concerned. In the example of FIG. 13, the first measurement pixel 36 from the right in the second row from the bottom of the grid 29 concerned is irradiated by the second shot of the beam (1) of coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 13, when the time becomes t=2Ttr, the measurement pixel 36 to be irradiated is shifted (changed) from the first measurement pixel 36 from the right in the second row from the bottom of the grid 29 concerned to the first measurement pixel 36 from the right in the third row from the bottom by collectively deflecting the multi-beams by the deflector 208. Since the XY stage 105 is moving also during this time period, the tracking operation is continuously performed. Then, the first measurement pixel 36 from the right in the third row from the bottom of the grid 29 concerned is irradiated by the third shot of the beam (1) of coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the pixel to be irradiated is shifted from the first measurement pixel 36 from the right in the third row from the bottom of the grid 29 concerned to the first measurement pixel 36 from the right in the fourth row from the bottom by collectively deflecting the multi-beams by the deflector 208. Since the XY stage 105 is moving also during this time period, the tracking operation is continuously performed. Then, the first measurement pixel 36 from the right in the fourth row from the bottom of the grid 29 concerned is irradiated by the fourth shot of the beam (1) of coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. By the process described above, irradiation of the measurement pixels 36 in the first column from the right of the grid 29 concerned has been completed.

In the example of FIG. 13, after irradiating the irradiation position of each beam which has been shifted (changed) three times from the initial position, the deflection control circuit 528 returns the tracking position to the start position of tracking where the tracking control was started, by resetting the beam deflection for tracking control. In other words, the tracking position is returned in the opposite direction to the direction of the stage movement. In the example of FIG. 13, when the time becomes t=4Ttr, tracking of the grid 29 concerned is released (removed), and the beam is swung back to a new target grid which has been shifted by eight beam pitches in the x direction. Although the beam (1) of the coordinates (1,3) has been described in the example of FIG. 13, irradiation is also similarly performed for each grid corresponding to a beam of other coordinates. That is, a beam of coordinates (n, m) completes irradiation of measurement pixels 36 in the first column from the right of a corresponding grid when the time becomes t=4Ttr. For example, a beam (2) of coordinates (2,3) completes irradiation of measurement pixels 36 in the first column from the right of a grid adjacent in the −x direction to the grid 29 concerned for the beam (1) of FIG. 13.

Since irradiation of the measurement pixels 36 in the first column from the right of each grid has been completed, in a next tracking cycle after resetting the tracking, the deflector 208 performs deflection such that the irradiation position of each corresponding beam is adjusted (shifted) to the second measurement pixel 36 from the right in the first row from the bottom of each grid.

As described above, each shot is performed while shifting the measurement pixel 36 one by one by the deflector 208, in a state such that the relative position of the irradiation region 34 is controlled by the deflector 208 to be unchanged to the substrate 101 during the same tracking cycle. Then, after finishing one tracking cycle and returning the tracking position of the irradiation region 34, as shown in the lower part of FIG. 11, the first shot position is adjusted to be the position shifted by one measurement pixel, for example. Then, while performing a next tracking control, each shot is performed shifting the measurement pixel 36 one by one by the deflector 208. By repeating this operation during scanning the stripe region 32, the position of the irradiation region 34 is moved sequentially, such as from 34a to 34o, to perform irradiation of the stripe region concerned. Then, using each shot of multi-beams, the detector 222 detects the secondary electron group 310 each time from the position irradiated with the multi-beams 20.

Detection data of the each secondary electron 300 configuring the secondary electron group 310 from a plurality of measurement pixels 36 irradiated with the multi-beams 20 in each shot detected by the detector 222 as described above is output to the detection circuit 106 in order of measurement. In the detection circuit 106, the A/D converter 70 converts the analog detection data to digital data to be stored in the storage device 72.

Similarly to the first embodiment, each stripe region 32 is divided in the x direction into a plurality of measurement image regions 21 for inspection as shown in FIG. 5. According to the second embodiment, it is preferable that each stripe region 32 is divided into a plurality of measurement image regions 21 by the same size as the irradiation region 34 to be irradiated by one irradiation of the multi-beams 20. According to the second embodiment, as shown in FIG. 5, each measurement image region 21 is divided into two-dimensional $n_2 \times m_2$ inspection pixels 37 (image reference region), where one of $n_2$ and $m_2$ is an integer of 1 or more and the other is an integer of 2 or more. According to the second embodiment, the inspection pixel 37 preferably has the same size as the grid. 29. Thus, each inspection pixel 37 is composed of two-dimensional $n_1 \times m_1$ measurement pixels 36, where one of $n_1$ and $m_1$ is an integer of 1 or more and the other is an integer of 2 or more.

Similarly to the first embodiment, as shown in FIG. 5, it is supposed that the measurement image region 21 is, for example, an 8×8 μm square in the x and y directions (two-dimensional), and the measurement pixel 36 is, for example, a 2×2 nm square in the x and y directions (two-dimensional). In such a case, 4000×4000 measurement pixels 36 are arranged in the x and y directions (two-dimensional) in one measurement image region 21. When the inspection pixel 37 is composed of, for example, 4×4 measurement pixels 36 in the x and y directions (two-dimensional), 1000×1000 inspection pixels 37 are arranged in the x and y directions (two-dimensional) in one measurement image region 21. Although the case of the inspection pixel 37 being composed of 4×4 measurement pixels 36 in the x and y directions (two-dimensional) is shown in the example of FIG. 5, it is not limited thereto. It may be composed of fewer measurement pixels 36, or more measurement pixels 36. However, if the size of the inspection pixel 37 exceeds 50 times the beam diameter size (size of the measurement pixel 36) of each electron beam configuring the multi-beams 20, there is a possibility of exceeding a practical limit of pattern inspection to be described later. Therefore, the inspection pixel 37 is preferably composed of 50×50 or less than 50×50 measurement pixels 36 in the x and y directions (two-dimensional). Thereby, the size of the inspection pixel 37 can be suppressed to be 50 or less than 50 times the beam diameter size (size of the measurement pixel 36) of an electron beam. If a defect size of the substrate 101 to be inspected is 2 nm, for example, the beam diameter size (size of the measurement pixel 36) of an electron beam should be set to 2 nm. In such a case, the size of the inspection pixel 37 should be set to be within 100 nm.

The unit synthesis unit 74 (data processing unit) inputs detection data (digital data) for each measurement pixel 36 irradiated with each electron beam of the multi-beams 20 from the storage device 72. Then, the unit synthesis unit 74 calculates, for each two-dimensional inspection pixel 37, a statistic value acquired from detection data of all the measurement pixels 36 in the inspection pixel 37 concerned. For example, an average value of signal strength is calculated. Alternatively, a maximum value, a minimum value, or a combined value of these values is calculated. The unit synthesis unit 74 defines, for each inspection pixel 37, a corresponding statistic value as image reference data (pixel value for inspection). Thus, the unit synthesis unit 74 synthesizes a plurality of measurement pixels 36 which are two-dimensionally adjacent to one another, as one inspection pixel 37. A measurement image of the measurement image region 21 concerned is configured by image reference data (pixel value for inspection) of all the inspection pixels 37 in the measurement image region 21. The image reference data of each inspection pixel 37 is stored in the stripe pattern memory 123, in units of the stripe region 32, for example.

The image reference data of each inspection pixel 37 accumulated in the stripe pattern memory 123 is transmitted to the comparison circuit 108, for example, through an optical fiber cable 121. It is preferable that image reference data of each inspection pixel 37 is transmitted in units of the stripe regions 32, for example. Alternatively, image reference data of each inspection pixel 37 may be transmitted in units of the measurement image region 21.

Each step of subsequent data processing for inspection is the same as that of the first embodiment.

As described above, two-dimensional $n_1 \times m_1$ measurement pixels 36 in each grid 29 (inspection pixel 37: image reference region) are irradiated with a plurality of different beams in the multi-beams 20. However, the scanning method is not limited to this. For example, it is also preferable that two-dimensional $n_1 \times m_1$ measurement pixels 36 in one grid 29 (inspection pixel 37: image reference region) are irradiated with the same beam, which is being deflected in order, of the multi-beams 20. Similarly, it is also preferable that two-dimensional $n_1 \times m_1$ measurement pixels 36 in one grid 29 (inspection pixel 37: image reference region) are irradiated with the same beam in the multi-beams 20 continuously without stopping by the raster scan system.

Moreover, although the XY stage 105 is continuously moved, it is not limited thereto. The XY stage 105 may be moved between the measurement image regions 21 by the step and repeat system. That is, it is also preferable that, in the state where the XY stage 105 is stopped, each grid 29 in one measurement image region 21 is scanned by a corresponding beam, which is being deflected, of the multi-beams 20. Then, irradiation of all the measurement pixels 36 in one measurement image region 21 is completed, the XY stage 105 should be moved so that a next measurement image region 21 may be adjusted to the position of the irradiation region 34.

As described above, according to the second embodiment, a large number of measurement pixels 36 can be simultaneously measured at a time by using the multi-beams 20. Therefore, inspection can be performed at high speed. Further, even when the diameter of each electron beam of the multi-beams 20 is small, the amount of data configuring the measurement image of the measurement image region 21 can be small. Also, the amount of data configuring a corresponding reference image can be small. Therefore, it is possible to realize the pattern inspection apparatus 500 that can perform data transmission and data processing without mounting therein fairly large-scale processors which are unrealistic.

With respect to the inspection pixel 37 which has been determined, as a comparison result, to be defective by the comparison circuit 108, it is desirable to review the inspection pixel 37 in detail in the detection circuit 506 using an image of detection data for each measurement pixel 36 before being synthesized. Then, according to the second embodiment similarly to the first embodiment, detection data (digital data) for each measurement pixel 36 to be irradiated with the electron beam 400 is temporarily stored in the buffer memory 525 of the detection circuit 506 to be accumulated therein. The accumulated data is saved until comparison processing is completed in the comparison circuit 108.

After completing the comparison processing, the comparison circuit 108 transmits information indicating whether to perform transmission or not to the buffer memory 525. In the buffer memory 525, whether to perform transmission or not is selected based on the transmitted information, and detection data of the measurement pixel 36 corresponding to the inspection pixel 37 which has been determined, as a comparison result, to be defective is transmitted to the comparison circuit 108. Then, the detection data of the measurement pixel 36 corresponding to the inspection pixel 37 determined to be defective, which has been stored in the buffer memory 525, is deleted. Alternatively, in the buffer memory 125, detection data of the measurement pixel 36 which is not needed to be transmitted is deleted. The transmitted detection data of each transmitted measurement pixel 36 is stored in the storage device 109 through the comparison circuit 108. Then, under the control of the control computer 110, the monitor 117 displays an image of the inspection pixel 37 having been determined to be defective, by using detection data of the measurement pixel 36 corresponding to the inspection pixel 37 having been determined to be defective. Details of a defective portion can be reviewed by visual contact with the image by a user.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a computer to execute the processor and the like should be stored in a recording medium, such as a magnetic disk drive, magnetic tape drive, FD, ROM (Read Only Memory), etc. For example, the position circuit 107, the comparison circuit 108, the development circuit 111, the reference circuit 112, etc. should be configured by the processing circuitry described above. Similarly, the unit synthesis unit 74, the dividing unit 54 for dividing into frames, the position alignment unit 58, and the comparison unit 60 should be configured by the processing circuitry described above. Each " . . . unit" of them may use a common processing circuitry (same processing circuitry), or different processing circuitries (separate processing circuitries).

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other pattern inspection apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern inspection apparatus comprising:
a stage configured to mount a substrate on which a plurality of figure patterns are formed and to be movable;
an electron beam column configured to include an emission source for emitting an electron beam, and a deflector for deflecting the electron beam, and to irradiate the substrate with the electron beam;
a detector configured to detect a secondary electron, including a reflection electron, emitted from the substrate because the substrate is irradiated with the electron beam;
a data processing circuitry configured to input detection data based on the secondary electron for each irradiation unit region of a plurality of irradiation unit regions on the substrate each of which is irradiated with the electron beam, where $n_1 \times m_1$ (one of $n_1$ and $m_1$ is an integer of 1 or more and another is an integer of 2 or more) irradiation unit regions being two-dimensional in the plurality of irradiation unit regions configure one of $n_2 \times m_2$ (one of $n_2$ and $m_2$ is an integer of 1 or more and another is an integer of 2 or more) image reference regions being two-dimensional configuring an inspection measurement image, to calculate, for each image reference region of the $n_2 \times m_2$ image reference regions, a statistic value acquired from the detection data of all of the $n_1 \times m_1$ irradiation unit regions in an image reference region concerned of the $n_2 \times m_2$ image reference regions, and to define the statistic value as image reference data for the image reference region concerned; and
a comparison processing circuitry configured to receive transmission of the image reference data for the each image reference region, and to compare, using a reference image corresponding to the inspection measurement image composed of the $n_2 \times m_2$ image reference regions, the measurement image with the reference image for the each image reference region.

2. The apparatus according to claim 1, wherein
the electron beam column irradiates the substrate with an electron beam at a time,
an inspection region in which the plurality of figure patterns are formed in the substrate is virtually divided into a plurality of stripe regions, each being strip-shaped, by a width size of a line of $m_1 \times m_2$ irradiation unit regions in the plurality of irradiation unit regions,
the electron beam column irradiates the each irradiation unit region in each line with an electron beam in order, for each of the plurality of stripe regions, while shifting the electron beam in a short width direction of the stripe region, and
the detector inputs the detection data for the each irradiation unit region in order from the $m_1 \times m_2$ irradiation unit regions arranged in the short width direction in accordance with a shift order of the electron beam.

3. The apparatus according to claim 2, wherein the image reference data for the each image reference region is transmitted per the stripe region to the comparison unit.

4. The apparatus according to claim 1, wherein
the electron beam column irradiates the substrate with $n_3 \times m_3$ (one of $n_3$ and $m_3$ is an integer of 1 or more and another is an integer of 2 or more) multi-beams being two-dimensional, at a time, and
$n_1 \times m_1$ irradiation unit regions being two-dimensional in the each image reference region are irradiated with a plurality of different beams in the $n_3 \times m_3$ multi-beams.

5. The apparatus according to claim 1, wherein a size of the irradiation unit region is set to be equivalent to a beam diameter size of the electron beam.

6. The apparatus according to claim 1, wherein one of an average value, a maximum value, and a minimum value of signal strength of the detection data is used as the statistic value.

7. The apparatus according to claim 1, further comprising:
a buffer memory configured to temporarily store the detection data for the each irradiation unit region;
a storage device configured to receive, from the buffer memory, transmission of the detection data for each of the $n_1 \times m_1$ irradiation unit regions, corresponding to an image reference region which has been determined to be defective in the $n_2 \times m_2$ image reference regions according to a comparison result, and to store the detection data for the each of the $n_1 \times m_1$ irradiation unit regions; and
a monitor configured to display an image of the image reference region which has been determined to be defective, by using the detection data for the each of the $n_1 \times m_1$ irradiation unit regions corresponding to the image reference region which has been determined to be defective.

8. The apparatus according to claim 4, wherein each beam of the plurality of different beams irradiates irradiation unit regions of one row of different rows in the $n_1 \times m_1$ irradiation unit regions.

9. A pattern inspection method comprising:
irradiating a substrate, on which a plurality of figure patterns are formed, with an electron beam;
detecting a secondary electron, including a reflection electron, emitted from the substrate because the substrate is irradiated with the electron beam;
inputting detection data based on the secondary electron for each irradiation unit region of a plurality of irradiation unit regions on the substrate each of which is irradiated with the electron beam, where $n_1 \times m_1$ (one of $n_1$ and $m_1$ is an integer of 1 or more and another is an integer of 2 or more) irradiation unit regions being two-dimensional in the plurality of irradiation unit regions configure one of $n_2 \times m_2$ (one of $n_2$ and $m_2$ is an integer of 1 or more and another is an integer of 2 or more) image reference regions being two-dimensional configuring an inspection measurement image, and calculating, for each image reference region of the $n_2 \times m_2$ image reference regions, a statistic value acquired from the detection data of all of the $n_1 \times m_1$ irradiation unit regions in an image reference region concerned of the $n_2 \times m_2$ image reference regions;
transmitting, for the each image reference region, the statistic value of the each image reference region, as image reference data; and
receiving the image reference data for the each image reference region, and comparing, using a reference image corresponding to the inspection measurement image composed of the $n_2 \times m_2$ image reference regions, the measurement image with the reference image for the each image reference region.

10. The method according to claim 9, wherein the transmitting the image reference data is performed through an optical fiber cable.

* * * * *